US008692579B2

(12) United States Patent
Kato

(10) Patent No.: US 8,692,579 B2
(45) Date of Patent: Apr. 8, 2014

(54) CIRCUIT AND METHOD OF DRIVING THE SAME

(75) Inventor: Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/471,625

(22) Filed: May 15, 2012

(65) Prior Publication Data

US 2012/0297219 A1    Nov. 22, 2012

(30) Foreign Application Priority Data

May 19, 2011    (JP) ................................. 2011-112845

(51) Int. Cl.
*H03K 19/096* (2006.01)

(52) U.S. Cl.
USPC ................ 326/95; 326/98; 326/112; 326/119

(58) Field of Classification Search
USPC ..................................................... 326/93–98
See application file for complete search history.

(56) References Cited

U.S. PATENT DOCUMENTS

| | | | |
|---|---|---|---|
| 4,656,607 A | | 4/1987 | Hagiwara et al. |
| 4,788,457 A | * | 11/1988 | Mashiko et al. ............... 326/108 |
| 4,797,576 A | | 1/1989 | Asazawa |
| 4,809,225 A | | 2/1989 | Dimmler et al. |
| 5,731,856 A | | 3/1998 | Kim et al. |
| 5,744,864 A | | 4/1998 | Cillessen et al. |
| 6,127,702 A | | 10/2000 | Yamazaki et al. |
| 6,294,274 B1 | | 9/2001 | Kawazoe et al. |
| 6,563,174 B2 | | 5/2003 | Kawasaki et al. |
| 6,576,943 B1 | | 6/2003 | Ishii et al. |
| 6,727,522 B1 | | 4/2004 | Kawasaki et al. |
| 6,738,281 B2 | | 5/2004 | Yokozeki |
| 6,788,567 B2 | | 9/2004 | Fujimori |
| 6,809,952 B2 | | 10/2004 | Masui |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; Agne Gijutsu Center (with English translation).

(Continued)

*Primary Examiner* — Anh Tran
(74) *Attorney, Agent, or Firm* — Fish & Richardson P.C.

(57) ABSTRACT

In order to reduce power consumption, an arithmetic circuit having a function of performing a logic operation processing based on an input signal, storing a potential set in accordance with the result of the logic operation processing as stored data, and outputting a signal with a value corresponding to the stored data as an output signal. The arithmetic circuit includes an arithmetic portion performing the logic operation processing, a first field-effect transistor controlling whether a first potential, which is the potential corresponding to the result of the logic operation processing is set, and a second field-effect transistor controlling whether the potential of the output signal data is set at a second potential which is a reference potential.

20 Claims, 25 Drawing Sheets

(56) References Cited

U.S. PATENT DOCUMENTS

| | | |
|---|---|---|
| 6,845,032 B2 | 1/2005 | Toyoda et al. |
| 6,876,023 B2 | 4/2005 | Ishii et al. |
| 6,944,045 B2 | 9/2005 | Fujimori |
| 6,972,986 B2 | 12/2005 | Peng et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,064,973 B2 | 6/2006 | Peng et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,616,040 B2 | 11/2009 | Motomura |
| 7,674,650 B2 | 3/2010 | Akimoto et al. |
| 7,732,819 B2 | 6/2010 | Akimoto et al. |
| 7,863,611 B2 | 1/2011 | Abe et al. |
| 8,202,365 B2 | 6/2012 | Umeda et al. |
| 8,274,078 B2 | 9/2012 | Itagaki et al. |
| 2001/0046027 A1 | 11/2001 | Tai et al. |
| 2002/0056838 A1 | 5/2002 | Ogawa |
| 2002/0074568 A1 | 6/2002 | Yoshida et al. |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0071039 A1 | 4/2004 | Fujimori |
| 2004/0127038 A1 | 7/2004 | Carcia et al. |
| 2004/0164778 A1 | 8/2004 | Toyoda et al. |
| 2005/0017302 A1 | 1/2005 | Hoffman |
| 2005/0169039 A1 | 8/2005 | Peng et al. |
| 2005/0169040 A1 | 8/2005 | Peng et al. |
| 2005/0199959 A1 | 9/2005 | Chiang et al. |
| 2005/0205921 A1 | 9/2005 | Ishii et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0095975 A1 | 5/2006 | Yamada et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0182455 A1* | 8/2007 | Wang et al. ................. 326/97 |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0048744 A1 | 2/2008 | Fukuoka |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197414 A1 | 8/2008 | Hoffman et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0258789 A1 | 10/2008 | Motomura |
| 2008/0296568 A1 | 12/2008 | Ryu et al. |
| 2009/0002044 A1 | 1/2009 | Kobayashi |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0019839 A1 | 1/2010 | Monden |
| 2010/0065844 A1 | 3/2010 | Tokunaga |
| 2010/0085081 A1* | 4/2010 | Ofuji et al. .................. 326/102 |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0264956 A1* | 10/2010 | Yin et al. .................... 326/120 |
| 2010/0320458 A1 | 12/2010 | Umeda et al. |
| 2010/0320459 A1 | 12/2010 | Umeda et al. |
| 2011/0010493 A1 | 1/2011 | Kimura et al. |
| 2011/0024741 A1 | 2/2011 | Abe et al. |
| 2011/0084731 A1 | 4/2011 | Kawae |
| 2011/0089975 A1 | 4/2011 | Yamazaki et al. |
| 2011/0102018 A1 | 5/2011 | Shionoiri et al. |
| 2011/0108837 A1 | 5/2011 | Yamazaki et al. |
| 2011/0121878 A1 | 5/2011 | Kato et al. |
| 2011/0148463 A1 | 6/2011 | Kato et al. |
| 2011/0187410 A1 | 8/2011 | Kato et al. |
| 2012/0161121 A1 | 6/2012 | Yamazaki |
| 2012/0297220 A1 | 11/2012 | Kato |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| | | |
|---|---|---|
| JP | 2004-273732 A | 9/2004 |
| JP | 2010-282721 A | 12/2010 |
| WO | 2004/114391 A1 | 12/2004 |

OTHER PUBLICATIONS

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.
Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.
Shoji Shukuri et al.; "A Semi-Static Complementary Gain Cell Technology for Sub-1 V Supply DRAM's"; IEEE Transactions on Electron Devices; Jun. 1, 1994; pp. 926-931; vol. 41, No. 6.
Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.
Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using Castep," Zeitschrift fur Kristallographie, 2005, vol. 220, pp. 567-570.
Coates, D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTS) for AMLCDs," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda., T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MoO3 As a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures over 1000° C.," Journal of Solid State Chemistry, 1985, vol. 60, pp. 382-384.
Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World's Largest (15-Inch) XGA AMLCD Panel Using IgZO Oxide TFT," SID Digest '08 : SID International Symposium Digest of Technical Papers, May 20, 2008, vol. 39, pp. 625-628.

(56) References Cited

OTHER PUBLICATIONS

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTS With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late—News Paper: 4 Inch QVGA AMOLED Driven by the Threshold Voltage Controlled Amorphous GiZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IgZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

● In
☾ Sn
☽ Zn
• O

- In
- Ga
- Zn
- O

● : In
○ : Ga or Zn
● : O

● : In
○ : Ga
○ : Zn
● : O

CIRCUIT AND METHOD OF DRIVING THE SAME

BACKGROUND OF THE INVENTION

1. Field of the Invention

An embodiment of the present invention relates to a circuit.

2. Description of the Related Art

In recent years, for higher performance of an electronic appliance, an arithmetic processing unit in which one chip includes an integrated circuit having a plurality of functions, such as a system LSI, has been developed.

In the above arithmetic processing unit, for example, functional circuits including a CMOS circuit, such as an arithmetic circuit and a storage circuit, are provided separately over one substrate, and data is transferred between the arithmetic circuit and the storage circuit through a wiring serving as a data bus (for example, see Patent Document 1).

Further, an arithmetic circuit which includes a storage means so as to have a function of performing a logic operation processing and storing data has been proposed. In the arithmetic circuit, data on the result of the logic operation processing can be stored without transferring the data through the data bus, so that the power consumption can be reduced.

REFERENCE

Patent Document

[Patent Document 1] Japanese Published Patent Application No. 2010-282721

SUMMARY OF THE INVENTION

However, in a conventional arithmetic circuit, data of the arithmetic circuit to be stored needs to be separately saved in a nonvolatile storage circuit because a storage means of the conventional arithmetic circuit is volatile. Power is accordingly consumed in saving the data; therefore, the power consumption of the conventional arithmetic circuit is not sufficiently low.

Further, the conventional arithmetic circuit has a problem in that the storage means includes a large number of elements and that the circuit has a large area.

An object of an embodiment of the invention is to reduce power consumption. Another object of an embodiment of the invention is to reduce the power consumption and circuit area.

An embodiment of the invention provides an integrated circuit which includes a plurality of arithmetic circuits and has a function of performing a logic operation processing and storing data on the result of the logic operation processing, which is configured as follows. Each of the arithmetic circuits includes an arithmetic portion, a first transistor controlling whether a potential of an output signal is set to a value corresponding to the result of the logic operation processing in the arithmetic portion, a second transistor controlling whether the potential of the output signal is set to a value corresponding to a reference potential, and a third transistor controlling whether the potential of the output signal is set to a value corresponding to a potential of a connection portion of the first and second transistors. Further, a field-effect transistor with low off-state current is used as each of the first and second transistors, the third transistor, or each of the first to third transistors.

In the above integrated circuit, by turning off the field-effect transistor having low off-state current, the data can be held in each arithmetic circuit. Further, by maintaining the off states of the field-effect transistors, the data can be stored for a long time.

An embodiment of the invention is an integrated circuit including an arithmetic circuit having a function of performing a logic operation processing based on an input signal, storing a potential corresponding to a result of the logic operation processing as stored data, and outputting a signal with a value corresponding to the stored data as an output signal. The arithmetic circuit includes an arithmetic portion performing the logic operation processing, a first field-effect transistor controlling whether a potential of the stored data is set at the potential corresponding to the result of the logic operation processing, a second field-effect transistor controlling whether the potential of the stored data is set at a reference potential, and a third field-effect transistor controlling whether the signal with a value corresponding to the stored data is output as the output signal. Further, an off-state current per micrometer of channel width of each of the first and second field-effect transistors, the third field-effect transistor, or each of the first to third field-effect transistors is lower than or equal to 10 aA.

According to an embodiment of the invention, data can be held with the power consumption suppressed; therefore, the power consumption can be reduced.

DETAILED DESCRIPTION OF THE INVENTION

Examples of embodiments describing the present invention will be described below with reference to the drawings. Note that it will be readily appreciated by those skilled in the art that details of the embodiments can be modified in various ways without departing from the spirit and scope of the invention. The invention is therefore not limited to the following description of the embodiments.

Note that the contents in different embodiments can be combined with one another as appropriate. In addition, the contents in different embodiments can be replaced with each other.

Further, the ordinal numbers such as "first" and "second" are used to avoid confusion between components and do not limit the number of each component.

(Embodiment 1)

This embodiment will show an example of an integrated circuit including a plurality of arithmetic circuits each of which includes a storage means and has a function of performing a logic operation processing and storing data on the result of the logic operation processing.

An example of the integrated circuit in this embodiment will be described with reference to FIGS. 1A and 1B.

Figure 1A:
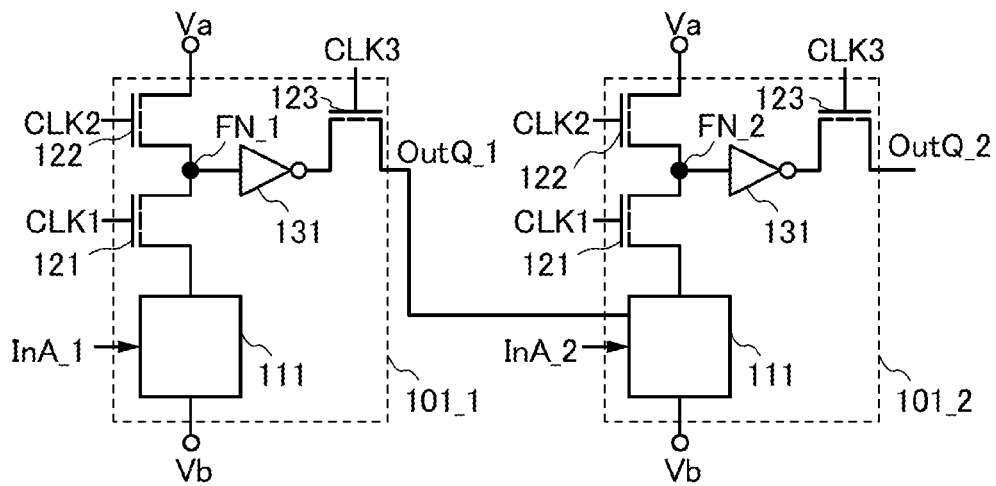
FIGS. 1A and 1B illustrate an example of an integrated circuit.

An integrated circuit in FIG. 1A includes an arithmetic circuit 101_1 and an arithmetic circuit 101_2.

An input signal InA_1 is input to the arithmetic circuit 101_1. The arithmetic circuit 101_1 has a function of performing a logic operation processing based on the input signal InA_1 and outputting an output signal OutQ_1 with a value corresponding to the result of the logic operation processing. Note that a plurality of input signals InA_1 which are different from one another may be used.

The signal output from the arithmetic circuit 101_1 is input to the arithmetic circuit 101_2 as one of input signals, and an input signal InA_2 is also input thereto. The arithmetic circuit 101_2 has a function of performing a logic operation processing based on the input signal InA_2 and outputting an output signal OutQ_2 with a value corresponding to the result of the logic operation processing. Note that a plurality of input signals InA_2 which are different from one another may be used.

Each of the arithmetic circuits 101_1 and 101_2 includes an arithmetic portion 111, a transistor 121, a transistor 122, an inverter 131, and a transistor 123. Note that the arithmetic circuits 101_1 and 101_2 do not always have the same configuration; at least the arithmetic circuit 101_1 needs to include the arithmetic portion 111, the transistor 121, the transistor 122, the inverter 131, and the transistor 123.

The arithmetic portion 111 has a function of performing the logic operation processing.

The arithmetic portion 111 includes a signal input terminal, a first terminal, and a second terminal Here, an input signal(s) InA (the input signal InA_1 in the arithmetic circuit 101_1, and the signal output from the arithmetic circuit 101_1 and the input signal InA_2 in the arithmetic circuit 101_2) are input to the signal input terminal, a potential Vb is given to the second terminal, and the arithmetic portion 111 performs the logic operation processing based on the input signal(s) input to the signal input terminal. Further, the arithmetic portion 111 switches a conducting state or a non-conducting state between the first terminal and the second terminal depending on the result of the logic operation processing.

The transistor 121 has a function of controlling whether a potential of the output signal OutQ (the output signal OutQ_1 in the arithmetic circuit 101_1, and the output signal OutQ_2 from the arithmetic circuit 101_1 in the arithmetic circuit 101_2) is set at the value corresponding to the result of the logic operation processing in the arithmetic portion 111.

An example of the transistor 121 is a field-effect transistor. Here, a potential of one of a source and a drain of the transistor 121 is set in accordance with the result of the logic operation processing in the arithmetic portion 111. Further, for example, a clock signal CLK1 is input to a gate of the transistor 121; however, without limitation, another signal or voltage may be applied to the gate of the transistor 121 so that the state of the transistor 121 can be changed.

The transistor 122 has a function of controlling whether the potential of the output signal OutQ_1 is set at a reference potential.

An example of the transistor 122 is a field-effect transistor. Here, a potential Va serving as the reference potential is given to one of a source and a drain of the transistor 122. The other of the source and the drain of the transistor 122 is electrically connected to the other of the source and the drain of the transistor 121; the connection portion is referred to as node FN (a node FN_1 in the arithmetic circuit 101_1, and a node FN_2 in the arithmetic circuit 101_2). Further, for example, a clock signal CLK2 is input to a gate of the transistor 122; however, without limitation, another signal or voltage may be applied to the gate of the transistor 122 so that the state of the transistor 122 can be changed.

The inverter 131 has a function of outputting a signal with a value corresponding to the potential of the node FN (the node FN_1 in the arithmetic circuit 101_1, and the node FN_2 in the arithmetic circuit 101_2). A signal with the potential of the node FN (the node FN_1 in the arithmetic circuit 101_1, and the node FN_2 in the arithmetic circuit 101_2) is input to the inverter 131, and the inverter 131 outputs the output signal OutQ (the output signal OutQ_1 in the arithmetic circuit 101_1, and the output signal OutQ_2 in the arithmetic circuit 101_2) with a value corresponding to the input signal(s). Note that the inverter 131 is not necessarily provided as long as charge can be held at the node FN (the node FN_1 in the arithmetic circuit 101_1, and the node FN_2 in the arithmetic circuit 101_2). For example, a switch or a buffer may be provided instead of the inverter 131.

The transistor 123 has a function of controlling whether the signal with a value corresponding to the potential of the node FN (the node FN_1 in the arithmetic circuit 101_1, and the node FN_2 in the arithmetic circuit 101_2) is output as the output signal OutQ (the output signal OutQ_1 in the arithmetic circuit 101_1, and the output signal OutQ_2 in the arithmetic circuit 101_2).

An example of the transistor 123 is a field-effect transistor. Here, a potential of one of a source and a drain of the transistor 123 has a value corresponding to the potential of the node FN (the node FN_1 in the arithmetic circuit 101_1, and the node FN_2 in the arithmetic circuit 101_2); for example, the signal output from the inverter 131 is input to the one of the source and the drain of the transistor 123. Further, for example, a clock signal CLK3 is input to a gate of the transistor 123; however, without limitation, another signal or voltage may be applied to the gate of the transistor 123 so that the state of the transistor 123 can be changed. Furthermore, the other of the source and the drain of the transistor 123 in the arithmetic circuit 101_1 is electrically connected to the arithmetic portion 111 in the arithmetic circuit 101_2.

Each of the transistors 121 and 122, the transistor 123, or each of the transistors 121 to 123 can be a transistor with low off-state current. In that case, the off-state current per micrometer of channel width of the transistor is 10 aA ($1\times10^{-17}$ A) or lower, preferably 1 aA ($1\times10^{-18}$ A) or lower, more preferably 10 zA ($1\times10^{-20}$ A) or lower, further preferably 1 zA ($1\times10^{-21}$ A) or lower, still further preferably 100 yA ($1\times10^{-22}$ A) or lower.

As the above transistor with low off-state current, it is possible to use a transistor including a semiconductor layer in which a channel is formed and which has a wider band gap than silicon, for example, 2 eV or more, preferably 2.5 eV or more, more preferably 3 eV or more. An example of the transistor having a wide band gap is a field-effect transistor including an oxide semiconductor layer in which a channel is formed.

Note that in FIG. 1A, the transistors 121 to 123 are each denoted by a circuit symbol for a transistor including the oxide semiconductor layer as an example, but are not limited to that transistor.

Note that one of the potentials Va and Vb is a high power supply potential Vdd, and the other is a low power supply potential Vss. The high power supply potential Vdd has a value relatively higher than the low power supply potential Vss, whereas the low power supply potential Vss has a value relatively lower than the high power supply potential Vdd. The values of the potentials Va and Vb might interchange depending on the conductivity type of the transistor, for example. Further, a difference between the potentials Va and Vb may be used as a power supply voltage.

As the clock signal CLK1, for example, a clock signal whose phase is delayed from that of the clock signal CLK2 by less than 1 cycle can be used. As the clock signal CLK3, for example, a clock signal whose phase is delayed from that of the clock signal CLK1 by less than 1 cycle can be used.

Note that the arithmetic circuits 101_1 and 101_2 do not always have the same configuration; for example, at least one of the arithmetic circuits needs to include the arithmetic portion 111, the transistor 121, the transistor 122, the inverter 131, and the transistor 123.

Next, as an example of a method of driving the integrated circuit in this embodiment, an example of a method of driving the integrated circuit in FIG. 1A will be described with reference to a timing chart shown in FIG. 1B. Here, for example, the transistors 121 to 123 are n-channel field-effect transistors including the above oxide semiconductor layer. Further, high-level potentials of the clock signals CLK1 to CLK3 are referred to as potential VH, and low-level potentials of the clock signals CLK1 to CLK3 are referred to as potential VL. Furthermore, the potential Va is a power supply potential Vdd, and the potential Vb is a ground potential Vgnd.

First, an off state of the transistor 121 is maintained, the transistor 122 is turned on, and an off state of the transistor 123 is maintained. For example, in a period T11 in FIG. 1B, by setting the clock signal CLK1 at a low level, the off state of the transistor 121 is maintained; by setting the clock signal CLK2 at a high level, the transistor 122 is turned on; and by setting the clock signal CLK3 at a low level, the off state of the transistor 123 is maintained.

At this time, the values of the potentials of the nodes FN_1 and FN_2 each become equivalent to that of the potential Va. Thus, the nodes FN_1 and FN_2 are precharged.

Next, the transistor 121 is turned on, the transistor 122 is turned off, and the transistor 123 remains off. For example, in a period T12 after the period T11 in FIG. 1B, by setting the clock signal CLK1 at a high level, the transistor 121 is turned on, and by setting the clock signal CLK2 at a low level, the transistor 122 is turned off.

At this time, the potential of the node FN_1 is set in accordance with the result of the logic operation processing in the arithmetic portion 111 based on the input signal InA_1, and the potential of the node FN_2 is set in accordance with the result of the logic operation processing in the arithmetic portion 111 based on the input signal InA_2. For example, in the period T12 in FIG. 1B, the first terminal and the second terminal of the arithmetic portion 111 in the arithmetic circuit 101_1 are in a conducting state in accordance with the result of the logic operation processing in the arithmetic portion 111 in the arithmetic circuit 101_1 and charge at the node FN_1 is gradually released so that the potential of the node FN_1 becomes equivalent to the potential Vb. Note that the invention is not limited to this; the potential of the node FN_2 may alternatively be changed. Further, the potential of the one of the source and the drain of the transistor 123 is set in accordance with the potential of the signal output from the inverter 131, i.e., the potential of the node FN_1 or the node FN_2.

Next, the transistor 121 is turned off, the transistor 122 remains off, and the transistor 123 is turned on. For example, in a period T13 after the period T12 in FIG. 1B, the transistor 123 is turned on because the clock signal CLK3 is at a high level.

At this time, as shown in the period T13, the output signal OutQ_1 is set at a high level and the output signal OutQ_2 is set at a low level. As a result, the values of the signals input to the arithmetic portions 111 in the arithmetic circuits 101_1 and 101_2 are determined.

Figure 1B:
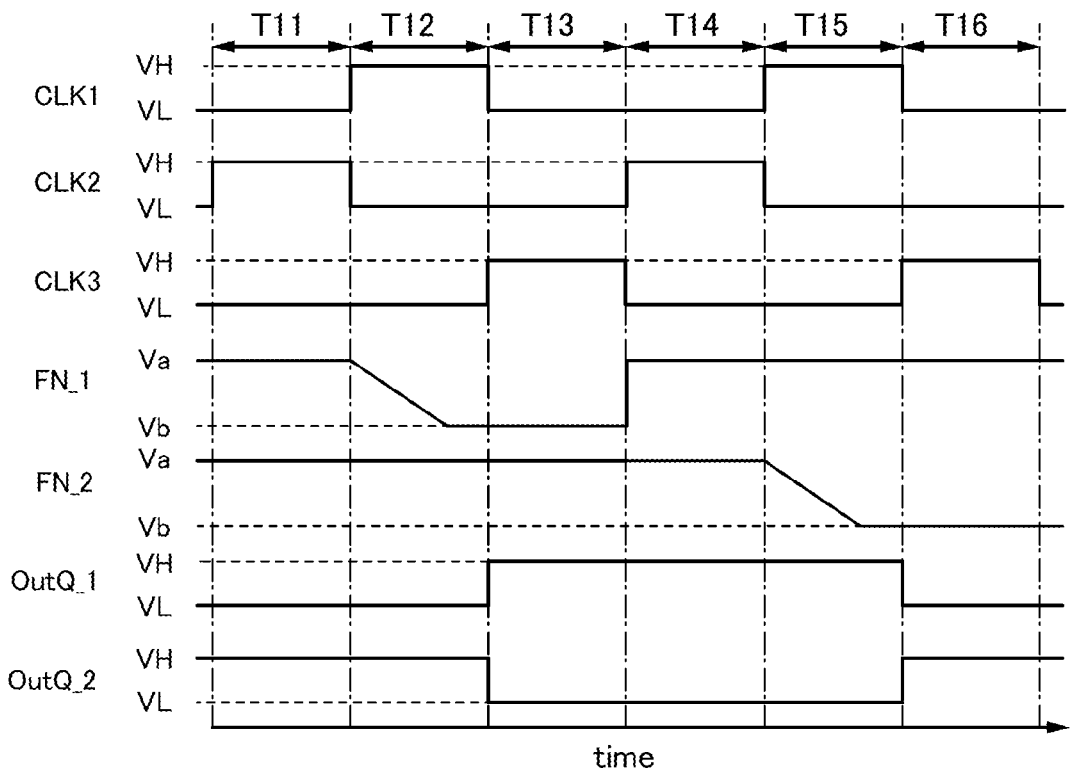

After that, for example, as shown in a period T14 after the period T13 in FIG. 1B, the transistor 121 may remain off, the transistor 122 may be turned on, and the transistor 123 may be turned off.

At this time, the values of the potentials of the nodes FN_1 and FN_2 each become equivalent to that of the potential Va. Thus, the nodes FN_1 and FN_2 are precharged.

Next, in a period T15 after the period T14, the transistor 121 is turned on, the transistor 122 is turned off, and the transistor 123 remains off.

At this time, as shown in the period T15, the first terminal and the second terminal of the arithmetic portion 111 in the arithmetic circuit 101_1 are in a non-conducting state in accordance with the result of the logic operation processing in the arithmetic portion 111 in the arithmetic circuit 101_1. Further, the first terminal and the second terminal of the arithmetic portion 111 in the arithmetic circuit 101_2 are in a conducting state and charge at the node FN_2 is gradually released so that the potential of the node FN_2 is changed.

Next, as shown in a period T16 after the period T15, the transistor 121 is turned off, the transistor 122 remains off, and the transistor 123 is turned on.

At this time, as shown in the period T16 in FIG. 1B, the output signal OutQ_1 is set at a low level and the output signal OutQ_2 is set at a high level. As a result, the values of the signals input to the arithmetic portions 111 in the arithmetic circuits 101_1 and 101_2 are determined.

Further, in the case where the transistors 121 and 122 are each a normally-off type transistor, the supply of the power supply voltage to the integrated circuit can be stopped. In order to stop the supply of the power supply voltage to the integrated circuit, first, at least the clock signals CLK1 and CLK2 or the clock signals CLK1 to CLK3 are set at low levels and then the supply of the clock signals CLK1 and CLK2 or the clock signals CLK1 to CLK3 to the integrated circuit is stopped. After that, the supply of the power supply voltage to the integrated circuit is stopped.

At this time, the values of potentials of the gates of the transistors 121 to 123 become equivalent to the low levels, so that the transistors 121 to 123 are in off states. However, potentials of the node FN_1 in the arithmetic circuit 101_1 and of the node FN_2 in the arithmetic circuit 101_2 are held as stored data.

The above description is the example of the method of driving the integrated circuit in FIG. 1A.

Figure 2A:
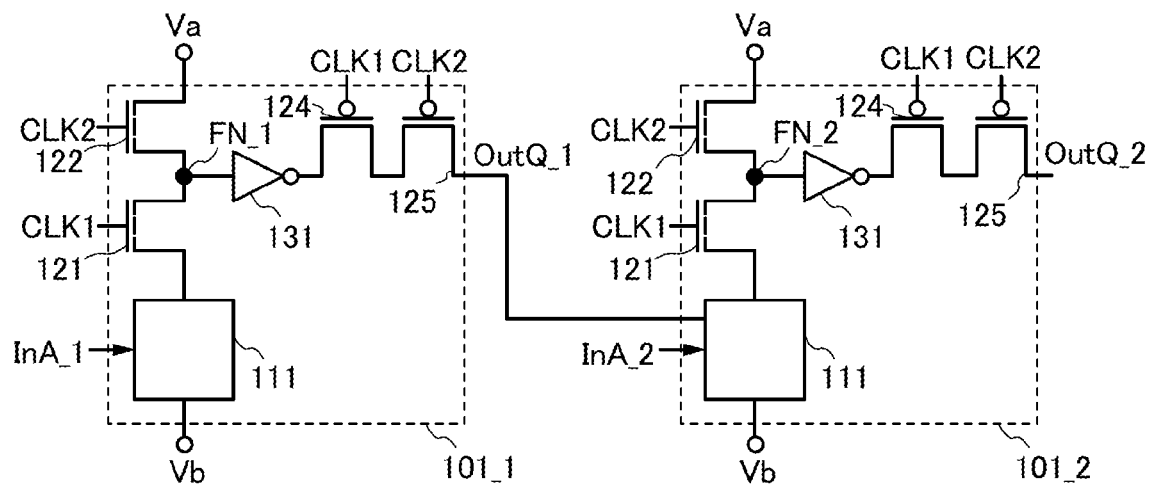
FIGS. 2A and 2B illustrate an example of an integrated circuit.

Note that the invention is not limited to the configuration in FIG. 1A; the arithmetic circuit can be configured without using the clock signal CLK3. FIG. 2A illustrates a configuration example of an arithmetic circuit in which the clock signal CLK3 is not used.

The arithmetic circuit in FIG. 2A includes a transistor 124 and a transistor 125 which are p-channel field-effect transistors instead of the transistor 123 in FIG. 1A.

In that case, one of the clock signals CLK1 and CLK2 (the clock signal CLK1 in FIG. 2A) is input to a gate of the transistor 124, the signal output from the inverter 131 is input to one of a source and a drain of the transistor 124, and a potential of the other of the source and the drain of the transistor 124 is set in accordance with a potential of the node FN (the node FN_1 in the arithmetic circuit 101_1, and the node FN_2 in the arithmetic circuit 101_2). Further, the other of the clock signals CLK1 and CLK2 (the clock signal CLK2 in FIG. 2A) is input to a gate of the transistor 125, and one of a source and a drain of the transistor 125 is electrically connected to the other of the source and the drain of the transistor 124.

Figure 2B:
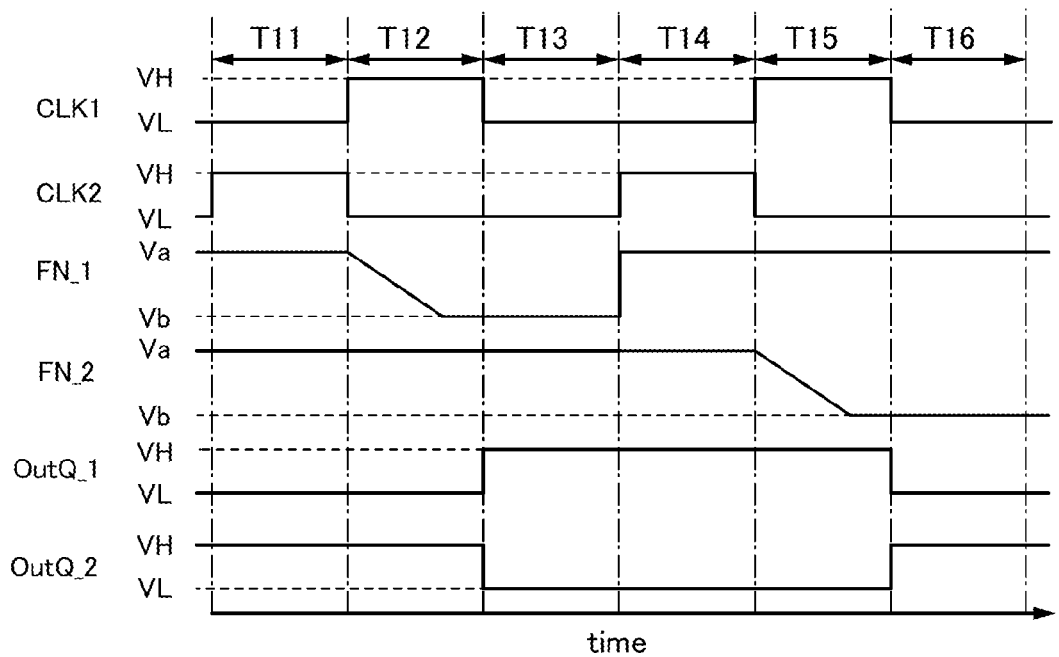

Further, in the example of the method of driving the integrated circuit in FIG. 2A, as shown in FIG. 2B, in the periods T11 and T14, the transistor 124 is turned on and the transistor 125 is turned off. In the periods T12 and T15, the transistor 124 is turned off and the transistor 125 is turned on. In the periods T13 and T16, the transistors 124 and 125 are turned on. Other operations are the same as in the description of the example of the method of driving the integrated circuit in FIG. 1A, so that the description of the example of the method of driving the integrated circuit in FIG. 1A is to be referred to as appropriate.

The arithmetic circuits 101_1 and 101_2 in FIG. 1A and FIG. 2A can perform a variety of logic operations depending on the configuration of the arithmetic portions 111. Examples of the configuration of the arithmetic circuit in FIG. 1A are illustrated in FIG. 3, FIGS. 4A to 4C, and FIGS. 5A to 5C. Note that FIG. 3, FIGS. 4A to 4C, and FIGS. 5A to 5C each illustrate only the configuration of the arithmetic circuit 101_1 for convenience, but this invention is not limited to this; the arithmetic circuit 101_2 can also have the same configuration.

Figure 3:
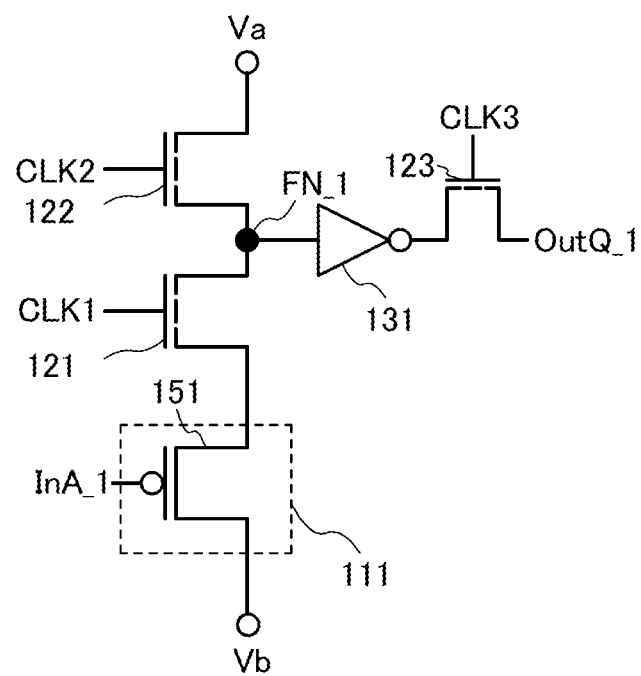
FIG. 3 illustrates an example of an arithmetic circuit in an integrated circuit.

An arithmetic circuit in FIG. 3 is an example of an arithmetic circuit performing a NOT operation. In the arithmetic circuit in FIG. 3, the arithmetic portion 111 includes a transistor 151 which is a p-channel field-effect transistor so as to perform the NOT operation. In this case, one of a source and a drain of the transistor 151 is electrically connected to the one of the source and the drain of the transistor 121, the potential Vb is given to the other of the source and the drain of the transistor 151, and the input signal InA_1 is input to a gate of the transistor 151.

Figure 4A:
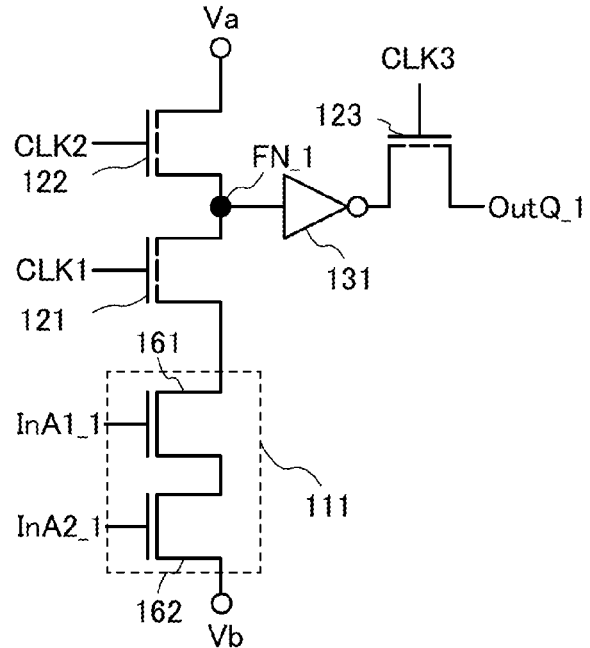
FIGS. 4A to 4C illustrate examples of an arithmetic circuit in an integrated circuit.

An arithmetic circuit in FIG. 4A is an example of an arithmetic circuit performing an AND operation. The arithmetic circuit in FIG. 4A includes a transistor 161 and a transistor 162 which are n-channel field-effect transistors so as to perform the AND operation. In this case, one of a source and a drain of the transistor 161 is electrically connected to the one of the source and the drain of the transistor 121, and an input signal InA1_1 is input to a gate of the transistor 161. Further, one of a source and a drain of the transistor 162 is electrically connected to the other of the source and the drain of the transistor 161, the potential Vb is given to the other of the source and the drain of the transistor 162, and an input signal InA2_1 is input to a gate of the transistor 162.

Figure 4B:
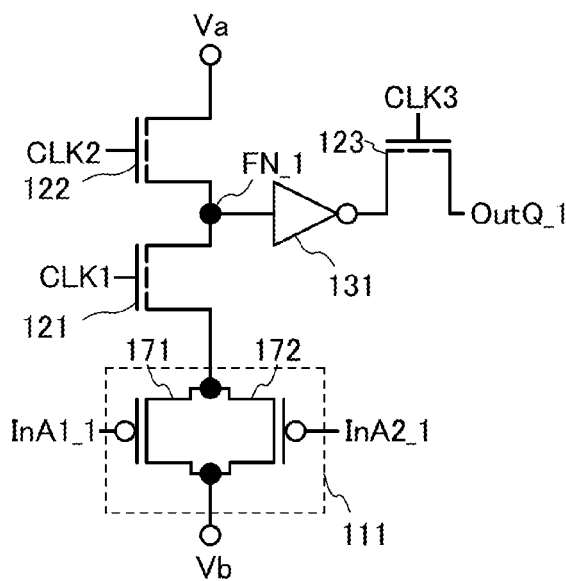

An arithmetic circuit in FIG. 4B is an example of an arithmetic circuit performing an OR operation. The arithmetic circuit in FIG. 4B includes a transistor 171 and a transistor 172 which are p-channel field-effect transistors so as to perform the OR operation. In this case, one of a source and a drain of the transistor 171 is electrically connected to the one of the source and the drain of the transistor 121, the potential Vb is given to the other of the source and the drain of the transistor 171, and the input signal InA1_1 is input to a gate of the transistor 171. Further, one of a source and a drain of the transistor 172 is electrically connected to the one of the source and the drain of the transistor 121, the potential Vb is given to the other of the source and the drain of the transistor 172, and an input signal InA2_1 is input to a gate of the transistor 172.

Figure 4C:
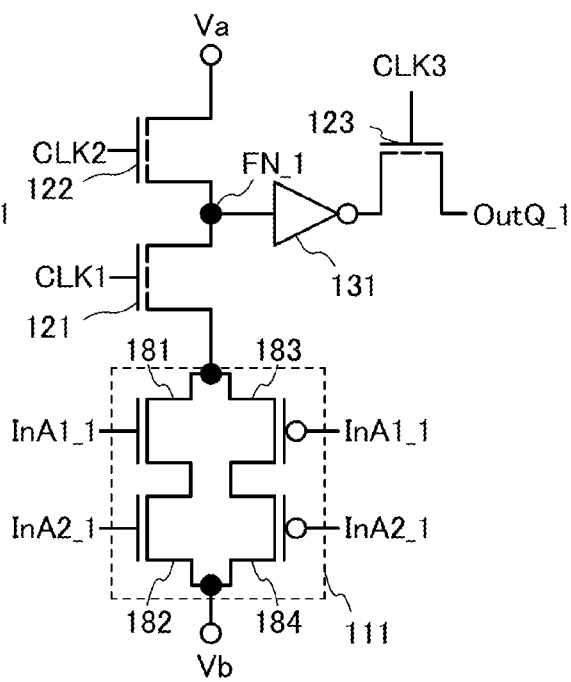

An arithmetic circuit in FIG. 4C is an example of an arithmetic circuit performing an ENOR operation. The arithmetic circuit in FIG. 4C includes a transistor 181 and a transistor 182 which are n-channel field-effect transistors, and a transistor 183 and a transistor 184 which are p-channel field-effect transistors so as to perform the ENOR operation. In this case, one of a source and a drain of the transistor 181 is electrically connected to the one of the source and the drain of the transistor 121, and the input signal InA1_1 is input to a gate of the transistor 181. Further, one of a source and a drain of the transistor 182 is electrically connected to the other of the source and the drain of the transistor 181, the potential Vb is given to the other of the source and the drain of the transistor 182, and the input signal InA2_1 is input to a gate of the transistor 182. Furthermore, one of a source and a drain of the transistor 183 is electrically connected to the one of the source and the drain of the transistor 121, and the input signal InA1_1 is input to a gate of the transistor 183. Furthermore, one of a source and a drain of the transistor 184 is electrically connected to the other of the source and the drain of the transistor 183, the potential Vb is given to the other of the source and the drain of the transistor 184, and the input signal InA2_1 is input to a gate of the transistor 184.

Figure 5A:
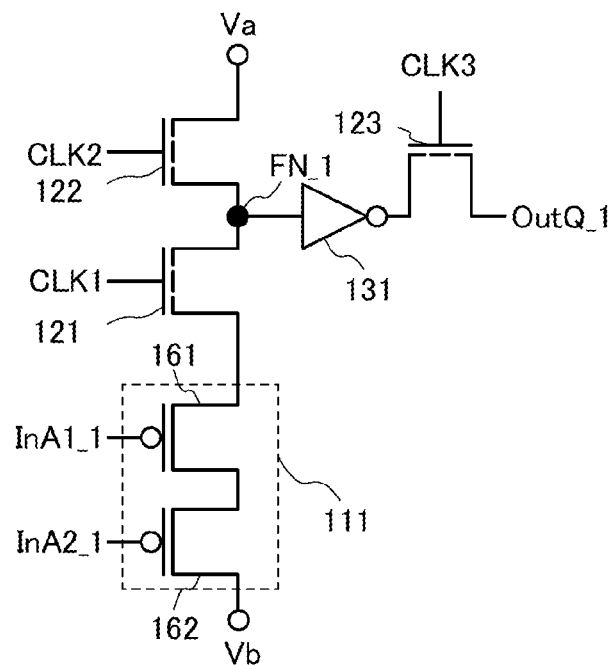
FIGS. 5A to 5C illustrate examples of an arithmetic circuit in an integrated circuit.
Figure 5B:
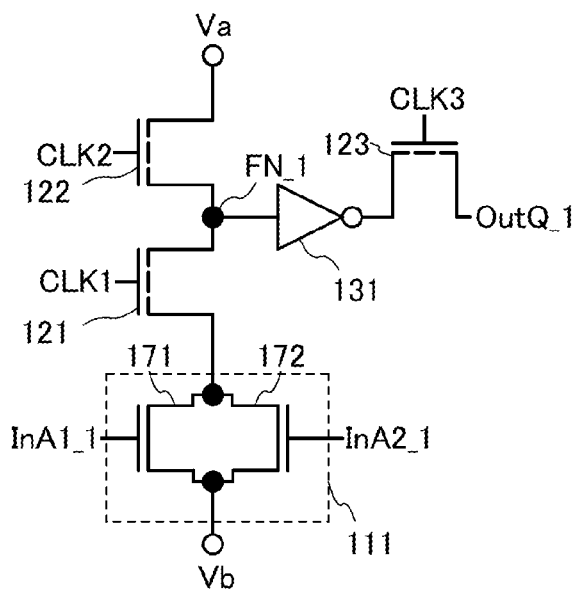
Figure 5C:
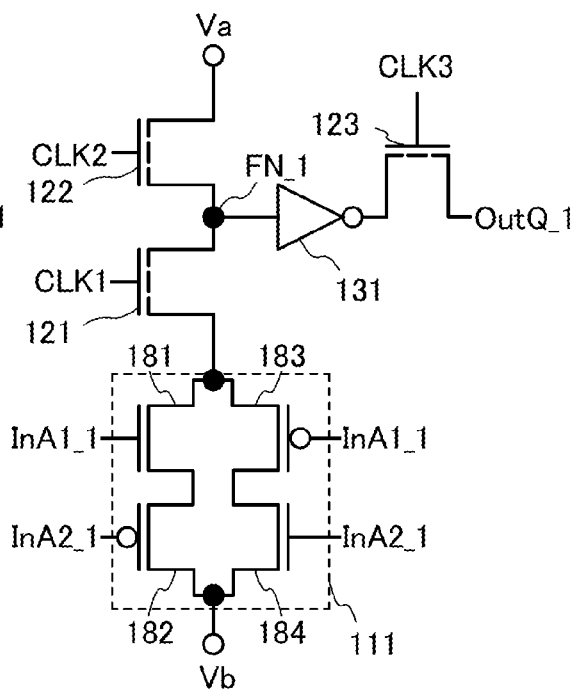

Note that as illustrated in FIG. 5A, by replacing the transistors 161 and 162 in FIG. 4A with p-channel field-effect transistors, the arithmetic circuit can perform a NAND operation. Further, as illustrated in FIG. 5B, by replacing the transistors 171 and 172 in FIG. 4B with n-channel field-effect transistors, the arithmetic circuit can perform a NOR operation. Furthermore, as illustrated in FIG. 5C, by replacing the transistor 182 in FIG. 4C with a p-channel field-effect transistor and the transistor 184 in FIG. 4C with an n-channel field-effect transistor, the arithmetic circuit can perform an EOR operation.

Examples of the arithmetic circuits in the integrated circuits in this embodiment are not limited to the above configurations; for example, a plurality of arithmetic circuits illustrated in any of FIGS. 1A and 1B, FIGS. 2A and 2B, FIG. 3, FIGS. 4A to 4C, and FIGS. 5A to 5C may be included in an arithmetic circuit which outputs a plurality of signals as output signals.

As described with reference to FIGS. 1A and 1B, FIGS. 2A and 2B, FIG. 3, FIGS. 4A to 4C, and FIGS. 5A to 5C, the integrated circuit exemplified in this embodiment includes a first arithmetic circuit (e.g., the arithmetic circuit 101_1) and a second arithmetic circuit (e.g., the arithmetic circuit 101_2). The first arithmetic circuit includes the arithmetic portion performing the logic operation processing, the first transistor (e.g., the transistor 121) controlling whether the potential of the output signal is set at the value corresponding to the result of the logic operation processing in the arithmetic portion, the second transistor (e.g., the transistor 122) controlling whether the potential of the output signal is set at the value corresponding to the reference potential, and the third transistor (e.g., the transistor 123) controlling whether the potential set by the first and second transistors is output as the output signal, thereby having a function of performing the logic operation processing and storing data. For example, by turning off the first and second transistors, the data can be stored in the arithmetic circuit without using a storage capacitor or the like. The above structure does not need a complementary structure of the arithmetic circuit; therefore, the arithmetic circuit can have a smaller number of transistors than in the case where a CMOS circuit is used. Further, the number of signal lines can be reduced, which can result in a reduction in circuit area. Furthermore, the through current can be reduced, which can result in a reduction in power consumption.

In the example of the integrated circuit according to this embodiment, the field-effect transistor with low off-state current is used as each of the first and second transistors, the third transistor, or each of the first to third transistors; therefore, the transistor in an off state can have reduced leakage current. Accordingly, the data can be held for a long time and does not need to be separately saved in a nonvolatile storage circuit; therefore, the operation speed can be increased and the power consumption can be reduced.

Table 1 shows comparison between a magnetic tunnel junction element (also referred to as MTJ element) used in an MRAM and the above nonvolatile storage circuit including a stack (also referred to as OS/Si) of a transistor including an oxide semiconductor and a transistor including a silicon semiconductor.

TABLE 1

|  | Spintronics (MTJ element) | OS/Si |
|---|---|---|
| 1. Heat resistance | Curie temperature | Process temperature around 500° C. (Reliability at 150° C.) |
| 2. Driving method | Current driving | Voltage driving |
| 3. Writing principle | Changing spin direction of magnetic body | On/off of FET |
| 4. Si LSI | Suitable for bipolar LSI (MOS device is preferable for high integration because bipolar device is unsuitable for high integration. Note that W gets larger.) | Suitable for MOS LSI |
| 5. Overhead | Large (due to high Joule heat) | Smaller by 2 to 3 or more orders of magnitude than the MTJ element (due to charging and discharging of parasitic capacitance) |
| 6. Nonvolatility | Utilizing spin | Utilizing low off-state current |
| 7. Number of reading times | Without limitation | Without limitation |
| 8. 3D conversion | Difficult (at most two layers) | Easy (the number of layers is limitless) |
| 9. Integration degree ($F^2$) | $4 F^2$ to $15 F^2$ | Depends on the number of layers stacked in 3D conversion (it is necessary to ensure heat resistance in process of forming upper OS FET) |
| 10. Material | Magnetic rare-earth element | Oxide semiconductor material |
| 11. Bit cost | High | Low (possibly slightly high depending on oxide semiconductor material (such as In)) |
| 12. Resistance to magnetic field | Low | High |

The MTJ element is disadvantageous in that magnetism is lost when the temperature is the Curie temperature or higher because a magnetic material is used. In addition, the MTJ element is compatible with a silicon bipolar device because current driving is employed; however, the bipolar device is unsuitable for high integration. Furthermore, the MTJ element has a problem in that its power consumption is increased with an increase in write current due to an increase in memory capacitance.

The MTJ element has low resistance to a magnetic field, so that the spin direction is likely to change when the MTJ element is exposed to a high magnetic field. Further, magnetic fluctuation is caused by nanoscaling of a magnetic body used for the MTJ element.

The material cost per bit of the MTJ element is expensive.

On the other hand, the transistor formed using an oxide semiconductor in this embodiment has an element structure and an operation principle which are similar to those of a silicon MOSFET except that a semiconductor material of a channel is a metal oxide. Further, the transistor formed using an oxide semiconductor is not influenced by a magnetic field, and does not cause soft errors. This shows that the transistor is highly conformable to a silicon integrated circuit.

(Embodiment 2)

This embodiment will show examples of a field-effect transistor that includes an oxide semiconductor layer and can be applied to the transistor in the arithmetic circuit in the above embodiments.

Examples of structured of transistors in this embodiment will be described with reference to FIGS. 6A and 6B.

Figure 6A:
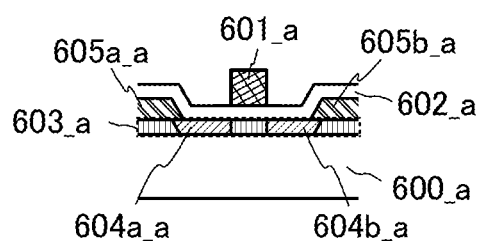
FIGS. 6A and 6B illustrate structural examples of a transistor.

The transistor illustrated in FIG. 6A includes a conductive layer 601_a, an insulating layer 602_a, a semiconductor layer 603_a, a conductive layer 605a_a, and a conductive layer 605b_a.

The semiconductor layer 603_a includes a region 604a_a and a region 604b_a. The region 604a_a and the region 604b_a are positioned apart from each other and doped with a dopant. Note that a region between the region 604a_a and the region 604b_a serves as a channel formation region. The semiconductor layer 603_a is provided over an element formation layer 600_a. Note that it is not necessary to provide the region 604a_a and the region 604b_a.

The conductive layer 605a_a and the conductive layer 605b_a are provided over the semiconductor layer 603_a and electrically connected to the semiconductor layer 603_a. Side surfaces of the conductive layers 605a_a and 605b_a are tapered.

The conductive layer 605a_a overlaps with part of the region 604a_a; however, this embodiment is not limited to this structure. When the conductive layer 605a_a overlaps with part of the region 604a_a, the resistance between the conductive layer 605a_a and the region 604a_a can be low. Further, a region of the semiconductor layer 603_a, which overlaps with the conductive layer 605a_a may be all the region 604a_a.

The conductive layer 605b_a overlaps with part of the region 604b_a; however, this embodiment is not limited to this structure. When the conductive layer 605b_a overlaps with part of the region 604b_a, the resistance between the conductive layer 605b_a and the region 604b_a can be low. Further, a region of the semiconductor layer 603_a, which overlaps with the conductive layer 605b_a may be all the region 604b_a.

The insulating layer 602_a is provided over the semiconductor layer 603_a, the conductive layer 605a_a, and the conductive layer 605b_a.

The conductive layer 601_a is provided over part of the insulating layer 602_a, and overlaps with the semiconductor layer 603_a, with the insulating layer 602_a placed therebetween. A region of the semiconductor layer 603_a, which overlaps with the conductive layer 601_a with the insulating layer 602_a placed therebetween, serves as the channel formation region.

Figure 6B:
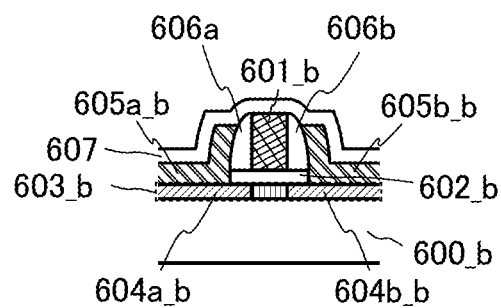

The transistor illustrated in FIG. 6B includes a conductive layer 601_b, an insulating layer 602_b, a semiconductor layer 603_b, a conductive layer 605a_b, a conductive layer 605b_b, an insulating layer 606a, an insulating layer 606b, and an insulating layer 607.

The semiconductor layer 603_b includes a region 604a_b and a region 604b_b. The region 604a_b and the region 604b_b are positioned apart from each other and doped with a dopant. The semiconductor layer 603_b is provided over the conductive layers 605a_b and 605b_b and an element formation layer 600_b, for example, and electrically connected to the conductive layers 605a_b and 605b_b. Note that it is not necessary to provide the region 604a_b and the region 604b_b.

The insulating layer 602_b is provided over part of the semiconductor layer 603_b.

The conductive layer 601_b is provided over part of the insulating layer 602_b, and overlaps with the semiconductor layer 603_b with the insulating layer 602_b placed therebetween. A region of the semiconductor layer 603_b, which overlaps with the conductive layer 601_b with the insulating layer 602_b placed therebetween, serves as the channel formation region of the transistor. Note that an insulating layer may be provided over the conductive layer 601_b.

The insulating layer 606a is provided over the insulating layer 602_b and is in contact with one of a pair of side surfaces of the conductive layer 601_b.

The insulating layer 606b is provided over the insulating layer 602_b and is in contact with the other of the pair of side surfaces of the conductive layer 601_b.

Note that the dopant concentration in the portions of the regions 604a_b and 604b_b, which overlap with the insulating layers 606a and 606b with the insulating layer 602_b placed therebetween, may be lower than that of the portions of the regions 604a_b and 604b_b, which do not overlap with the insulating layers 606a and 606b.

The conductive layers 605a_b and 605b_b are provided over the semiconductor layer 603_b.

The conductive layer 605a_b is electrically connected to the region 604a_b and is in contact with the insulating layer 606a.

The conductive layer 605b_b is electrically connected to the region 604b_b and is in contact with the insulating layer 606b.

The insulating layer 607 is provided over the conductive layer 601_b, the conductive layers 605a_b and 605b_b, and the insulating layers 606a and 606b.

Next, the components illustrated in FIGS. 6A and 6B will be described.

As the element formation layers 600_a and 600_b, insulating layers or substrates having insulating surfaces can be used, for example. Further, layers over which elements are formed in advance can be used as the element formation layers 600_a and 600_b.

Each of the conductive layers 601_a and 601_b has a function of a gate of the transistor. Note that a layer functioning as a gate of the transistor can be called gate electrode or gate wiring.

As the conductive layers 601_a and 601_b, it is possible to use, for example, a layer of a metal material such as molybdenum, magnesium, titanium, chromium, tantalum, tungsten, aluminum, copper, neodymium, or scandium or an alloy material containing any of these materials as a main component. Moreover, the conductive layers 601_a and 601_b can be a stack of layers containing materials applicable to the conductive layers 601_a and 601_b.

Each of the insulating layers 602_a and 602_b has a function of a gate insulating layer of the transistor.

Each of the insulating layers 602_a and 602_b can be, for example, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, or a lanthanum oxide layer. Moreover, the insulating layers 602_a and 602_b can be a stack of layers containing materials applicable to the insulating layers 602_a and 602_b.

Alternatively, as the insulating layers 602_a and 602_b, an insulating layer of a material containing, for example, an element that belongs to Group 13 in the periodic table and oxygen can be used. For example, when the semiconductor layers 603_a and 603_b contain a Group 13 element, the use of insulating layers containing a Group 13 element as insulating layers in contact with the semiconductor layers 603_a and 603_b makes the state of interfaces between the insulating layers and the oxide semiconductor layers favorable.

Examples of the material containing a Group 13 element and oxygen include gallium oxide, aluminum oxide, aluminum gallium oxide, and gallium aluminum oxide. Note that aluminum gallium oxide refers to a substance in which the content of aluminum is larger than that of gallium in atomic percent, and gallium aluminum oxide refers to a substance in which the content of gallium is larger than or equal to that of aluminum in atomic percent. For example, it is possible to use a material represented by $Al_2O_x$ ($x=3+\alpha$, where $\alpha$ is larger than 0 and smaller than 1), $Ga_2O_x$ ($x=3+\alpha$, where $\alpha$ is larger than 0 and smaller than 1), or $Ga_xAl_{2-x}O_{3+\alpha}$ (x is larger than 0 and smaller than 2 and $\alpha$ is larger than 0 and smaller than 1).

The insulating layers 602_a and 602_b can be a stack of layers of materials applicable to the insulating layers 602_a and 602_b. For example, the insulating layers 602_a and 602_b can be a stack of layers containing gallium oxide represented by $Ga_2O_x$. Alternatively, the insulating layers 602_a and 602_b may be a stack of an insulating layer containing gallium oxide represented by $Ga_2O_x$ and an insulating layer containing aluminum oxide represented by $Al_2O_x$.

Each of the semiconductor layers 603_a and 603_b functions as a layer in which a channel of the transistor is formed. Examples of an oxide semiconductor applicable to the semiconductor layers 603_a and 603_b are In-based oxide (e.g., indium oxide), Sn-based oxide (e.g., tin oxide), and Zn-based oxide (e.g., zinc oxide).

As the metal oxide, a four-component metal oxide, a three-component metal oxide, or a two-component metal oxide can also be used, for example. Note that a metal oxide which can be used as the above oxide semiconductor may include gallium as a stabilizer for reducing variation in characteristics. A metal oxide which can be used as the above oxide semiconductor may include tin as the stabilizer. A metal oxide which can be used as the above oxide semiconductor may include hafnium as the stabilizer. A metal oxide which can be used as the above oxide semiconductor may include aluminum as the stabilizer. A metal oxide which can be used as the above oxide semiconductor may include one or more of the following materials as the stabilizer: lanthanum, cerium, praseodymium, neodymium, samarium, europium, gadolinium, terbium, dysprosium, holmium, erbium, thulium, ytterbium, and lutetium, which are lanthanoid. Further, the metal oxide that can be used as the oxide semiconductor may contain silicon oxide.

Examples of a four-component metal oxide include an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Examples of a three-component metal oxide include an In—Ga—Zn-based oxide (also referred to as IGZO), an In—Sn—Zn-based oxide, an In—Al—Zn-based oxide, Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, and an In—Lu—Zn-based oxide.

Examples of a two-component metal oxide include an In—Zn-based oxide, a Sn—Zn-based oxide, an Al—Zn-based oxide, a Zn—Mg-based oxide, a Sn—Mg-based oxide, an In—Mg-based oxide, an In—Sn-based oxide, and an In—Ga-based oxide.

Note that for example, an In—Ga—Zn-based oxide refers to an oxide containing In, Ga, and Zn, and there is no limitation on the composition ratio of In, Ga, and Zn. The In—Ga—Zn-based oxide may contain a metal element other than In, Ga, and Zn.

As the oxide semiconductor, a material represented by $InLO_3(ZnO)_m$ (m is larger than 0) can be used. Here, L in $InLO_3(ZnO)_m$ represents one or more metal elements selected from Ga, Al, Mn, and Co.

As the oxide semiconductor, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Moreover, as the oxide semiconductor, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8) or any of oxides whose composition is in the neighborhood of the above compositions can be used.

Without limitation to the materials given above, a material with an appropriate composition can be used depending on required semiconductor characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

As the semiconductor layers 603_a and 603_b, it is possible to use a layer of a crystal with c-axis alignment (c-axis aligned crystal (CAAC)), which has a triangular or hexagonal atomic arrangement when seen from the direction of an a-b plane, a surface, or an interface. In the crystal, metal atoms are arranged in a layered manner or metal atoms and oxygen atoms are arranged in a layered manner along the c-axis, and the direction of the a-axis or the b-axis is varied in the a-b plane (the crystal rotates around the c-axis).

The CAAC is not single crystal, but this does not mean that the CAAC is composed of only an amorphous component. Although the CAAC includes a crystallized portion (crystalline portion), a boundary between one crystalline portion and another crystalline portion is not clearly distinguished in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

An example of such a CAAC is a crystal which is formed into a film shape and has a triangular or hexagonal atomic arrangement when observed from the direction perpendicular to a surface of the film or a surface of a substrate, and in which metal atoms are arranged in a layered manner or metal atoms and oxygen atoms (or nitrogen atoms) are arranged in a layered manner when a cross section of the film is observed.

As the oxide semiconductor, it is possible to use a semiconductor material with a composition represented by $In_P Ga_Q O_R (ZnO)_M$ ($0<P<2$, $0<Q<2$, and $M=1$ to 3) as the entire layer including a c-axis-aligned crystalline region with a composition represented by $In_{1+\delta}Ga_{1-\delta}O_3(ZnO)_M$ ($0<\delta<1$ and M=1 to 3).

For example, in the case where the semiconductor layers 603_a and 603_b are oxide semiconductor layers containing the CAAC and the channel length of the transistor is 30 nm, a short-channel effect can be prevented even when the semiconductor layers 603_a and 603_b have a thickness of about 5 nm, for instance.

Examples of a crystal structure of the CAAC will be described with reference to FIGS. 7A to 7E, FIGS. 8A to 8C, FIGS. 9A to 9C, and FIGS. 10A and 10B. In FIGS. 7A to 7E, FIGS. 8A to 8C, FIGS. 9A to 9C, and FIGS. 10A and 10B, the vertical direction corresponds to the c-axis direction and a plane perpendicular to the c-axis direction corresponds to the a-b plane, unless otherwise specified. Note that an "upper half" and a "lower half" refer to an upper half above the a-b plane and a lower half below the a-b plane (an upper half and a lower half with respect to the a-b plane). Furthermore, in FIGS. 7A to 7E, O surrounded by a circle represents tetracoordinate O and O surrounded by a double circle represents tricoordinate O.

Figure 7A:
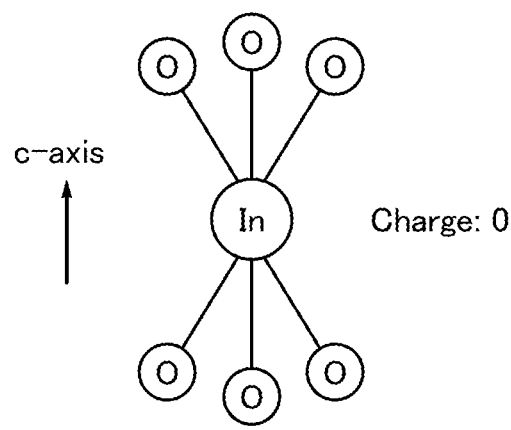
FIGS. 7A to 7E illustrate a structural example of CAAC.

FIG. 7A illustrates a structure including one hexacoordinate indium (hexacoordinate In) atom and six tetracoordinate oxygen (tetracoordinate O) atoms proximate to the hexacoordinate In atom. Note that a structure including one metal atom such as an In atom and oxygen atoms proximate to the metal atom is referred to as small group. In FIG. 7A, an octahedral structure is illustrated as a planar structure for convenience. Three tetracoordinate O atoms exist in each of the upper and lower halves in FIG. 7A. The total electric charge of the small group in FIG. 7A is 0.

Figure 7D:
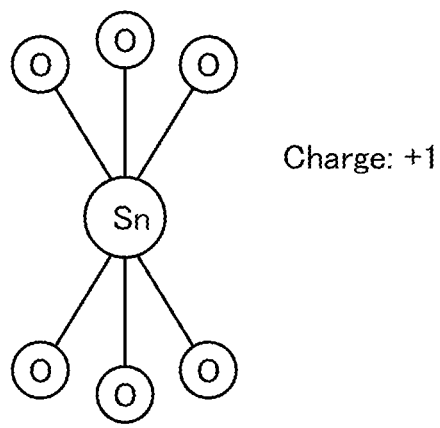
Figure 7B:
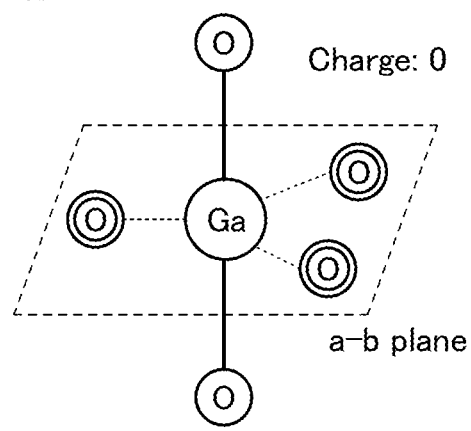

FIG. 7B illustrates a structure including one pentacoordinate Ga atom, three tricoordinate oxygen (tricoordinate O) atoms proximate to the pentacoordinate Ga atom, and two tetracoordinate O atoms proximate to the pentacoordinate Ga atom. All the three tricoordinate O atoms exist on the a-b plane. In FIG. 7B, the tetracoordinate O atom exists in each of the upper and lower halves. Since there is a pentacoordinate indium (pentacoordinate In) atom as well as a hexacoordinate In atom, the structure in FIG. 7B can be composed of a pentacoordinate In atom, three tricoordinate O atoms, and two tetracoordinate O atoms. The total electric charge of the small group in FIG. 7B is 0.

Figure 7E:
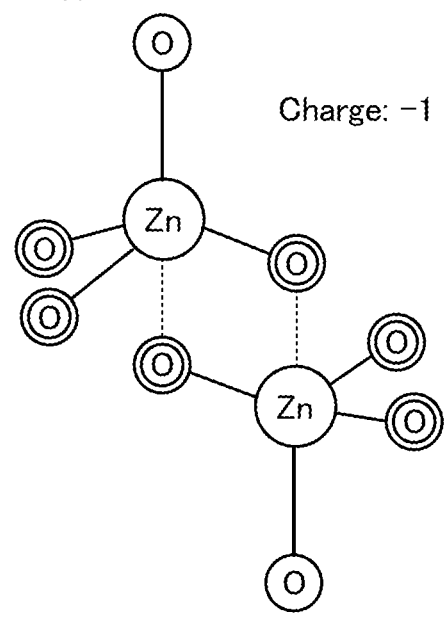
Figure 7C:
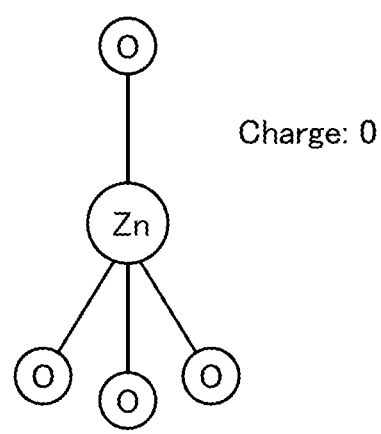

FIG. 7C illustrates a structure including one tetracoordinate zinc (tetracoordinate Zn) atom and four tetracoordinate O atoms proximate to the tetracoordinate Zn atom. In FIG. 7C, one tetracoordinate O atom exists in the upper half and three tetracoordinate O atoms exist in the lower half. Alternatively, in FIG. 7C, three tetracoordinate O atoms may exist in the upper half and one tetracoordinate O atom may exist in the lower half. The total electric charge of the small group in FIG. 7C is 0.

FIG. 7D illustrates a structure including one hexacoordinate tin (hexacoordinate Sn) atom and six tetracoordinate O atoms proximate to the hexacoordinate Sn atom. In FIG. 7D, three tetracoordinate O atoms exist in each of the upper and lower halves. The total electric charge of the small group in FIG. 7D is +1.

FIG. 7E illustrates a small group including two zinc atoms. In FIG. 7E, one tetracoordinate O atom exists in each of the upper and lower halves. The total electric charge of the small group in FIG. 7E is −1.

Note that a plurality of small groups form a medium group, and a plurality of medium groups form a large group.

A rule of bonding between the small groups is described below. For example, three tetracoordinate O atoms in the upper half with respect to a hexacoordinate In atom in FIG. 7A are each bonded to three hexacoordinate In atoms which are proximate to and below the tetracoordinate O atom in the upper half, and three tetracoordinate O atoms in the lower half are each bonded to three hexacoordinate In atoms which are proximate to and above the tetra coordinate O atom in the lower half. One tricoordinate O atom in the upper half with respect to a pentacoordinate Ga atom is bonded to one pentacoordinate Ga atom which is proximate to and below the tricoordinate O atom in the upper half, and one tricoordinate O atom in the lower half is bonded to one pentacoordinate Ga atom which is proximate to and above the tricoordinate O atom in the lower half. Moreover, one tetracoordinate O atom in the upper half with respect to a tetracoordinate Zn atom is bonded to one tetracoordinate Zn atom which is proximate to and below the tetracoordinate O atom in the upper half, and three tetracoordinate O atoms in the lower half are each bonded to three tetracoordinate Zn atoms which are proximate to and above the tetracoordinate O atom in the lower half In this manner, the number of tetracoordinate O atoms above a metal atom is equal to the number of proximate metal atoms below each tetracoordinate O atom. Similarly, the number of tetracoordinate O atoms below a metal atom is equal to the number of proximate metal atoms above each tetracoordinate O atom. Here, since the coordination number of the tetracoordinate O atom is 4, the total number of proximate metal atoms below and above the O atom is 4. Accordingly, when the sum of the number of tetracoordinate O atoms above a metal atom and the number of tetracoordinate O atoms below another metal atom is 4, two kinds of small groups including the metal atoms can be bonded to each other. For example, in the case where a hexacoordinate metal (In or Sn) atom is bonded through three tetracoordinate O atoms in the lower half, it is bonded to a pentacoordinate metal atom or a tetracoordinate metal atom.

A metal atom whose coordination number is 4, 5, or 6 is bonded to another metal atom through a tetracoordinate O atom in the c-axis direction. In addition, a medium group can be formed by combining a plurality of small groups so that the total electric charge of the layered structure is 0.

Figure 8A:
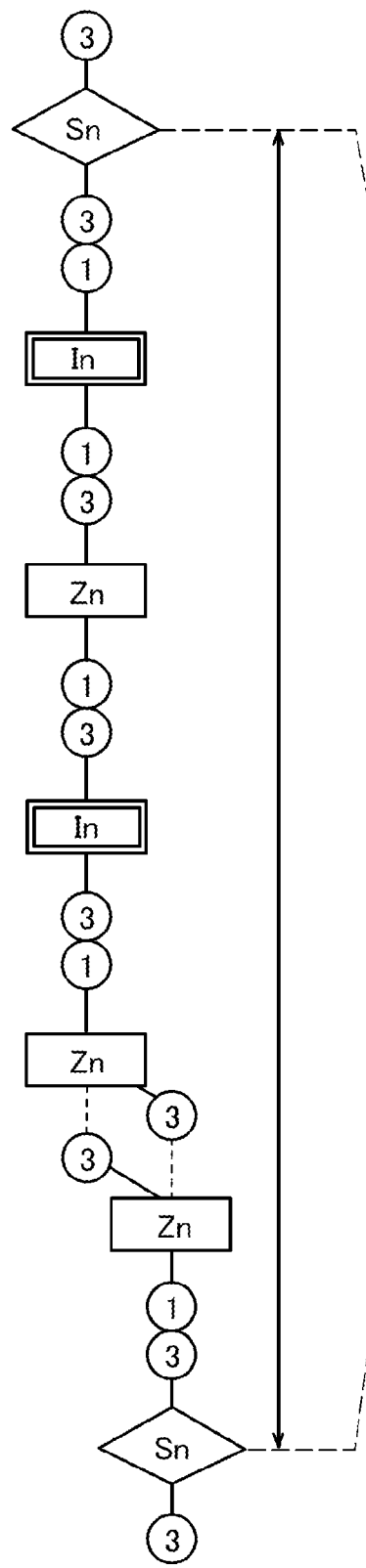
FIGS. 8A to 8C illustrate a structural example of CAAC.
Figure 8B:
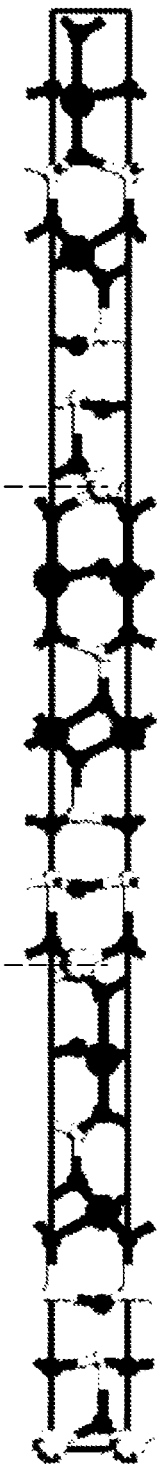
Figure 8C:
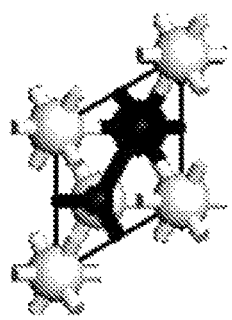

FIG. 8A illustrates a model of a medium group included in a layered structure of an In—Sn—Zn-based oxide. FIG. 8B illustrates a large group including three medium groups. FIG. 8C illustrates an atomic arrangement where the layered structure shown in FIG. 8B is observed from the c-axis direction.

Note that in FIG. 8A, for convenience, a tricoordinate O atom is omitted and only the number of tetracoordinate O atoms is shown in a circle; for example, three tetracoordinate O atoms existing in each of the upper and lower halves with respect to a Sn atom are denoted by circled 3. Similarly, in FIG. 8A, one tetracoordinate O atom existing in each of the upper and lower halves with respect to an In atom is denoted by circled 1. FIG. 8A also shows a Zn atom proximate to one tetracoordinate O atom in the lower half and three tetracoordinate O atoms in the upper half, and a Zn atom proximate to one tetracoordinate O atom in the upper half and three tetracoordinate O atoms in the lower half.

The medium group included in the layered structure of the In—Sn—Zn-based oxide in FIG. 8A has the following structure. In the order starting from the top, a Sn atom proximate to three tetracoordinate O atoms in each of the upper and lower halves is bonded to an In atom proximate to one tetracoordinate O atom in each of the upper and lower halves; the In atom is bonded to a Zn atom proximate to three tetracoordinate O atoms in the upper half, and is bonded to an In atom proximate to three tetracoordinate O atoms in each of the upper and lower halves through one tetracoordinate O atom in the lower half and the Zn atom; and the In atom is bonded to a small group that includes two Zn atoms and is proximate to one tetracoordinate O atom in the upper half, and is bonded to a Sn atom proximate to three tetracoordinate O atoms in each of the upper and lower halves through one tetracoordinate O atom in the lower half of the small group. A plurality of the medium groups are bonded to form a large group.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, total electric charge in a small group including a Sn atom is +1. Therefore, electric charge of −1, by which the electric charge of +1 is canceled, is needed to form a layered structure including a Sn atom. As a structure having total electric charge of −1, the small group including two Zn atoms as illustrated in FIG. 7E can be given. For example, with one small group including two Zn atoms, total electric charge of one small group including a Sn atom can be cancelled, so that the total electric charge of the layered structure can be 0.

Further, a crystal of an In—Sn—Zn-based oxide ($In_2SnZn_3O_8$) can be obtained with a structure in which the large group in FIG. 8B is repeated. The layered structure of the In—Sn—Zn-based oxide can be expressed by a composition formula, $In_2SnZn_2O_7(ZnO)_m$ (m is 0 or a natural number).

The same can be said for the case of using the other four-component metal oxides, three-component metal oxides, and two-component metal oxides shown in this embodiment and other metal oxides.

Figure 9A:
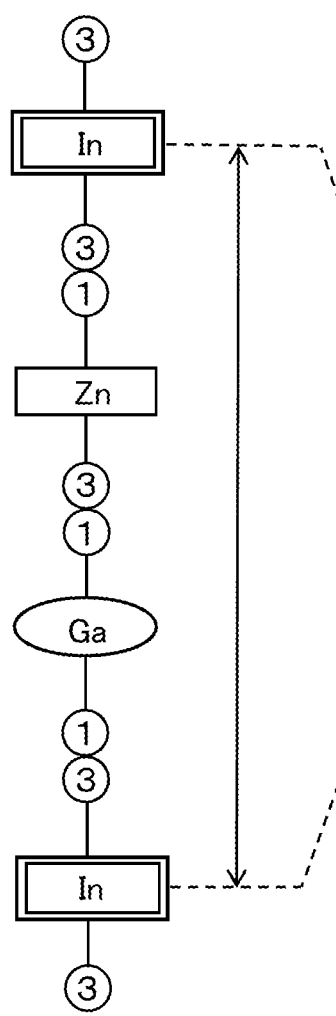
FIGS. 9A to 9C illustrate a structural example of CAAC.

As an example, FIG. 9A illustrates a model of a medium group included in a layered structure of an In—Ga—Zn-based oxide.

The medium group included in the layered structure of the In—Ga—Zn-based oxide in FIG. 9A has the following structure. In the order starting from the top, an In atom proximate to three tetracoordinate O atoms in each of the upper and lower halves is bonded to a Zn atom proximate to one tetracoordinate O atom in the upper half; the Zn atom is bonded to a Ga atom proximate to one tetracoordinate O atom in each of the upper and lower halves through three tetracoordinate O atoms in the lower half with respect to the Zn atom; and the Ga atom is bonded to an In atom proximate to three tetracoordinate O atoms in each of the upper and lower halves through one tetracoordinate O atom in the lower half with respect to the Ga atom. A plurality of the medium groups are bonded to form a large group.

Figure 9B:
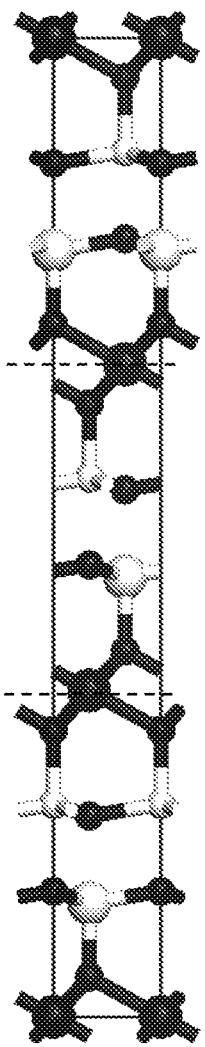
Figure 9C:
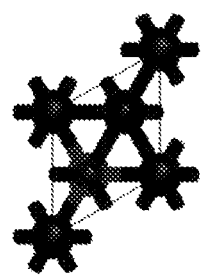

FIG. 9B illustrates a large group including three medium groups. FIG. 9C illustrates an atomic arrangement where the layered structure shown in FIG. 9B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, total electric charge of a small group including any of the In atom, the Zn atom, and the Ga atom is 0. As a result, the total electric charge of a medium group having a combination of these small groups is always 0.

In order to form the layered structure of the In—Ga—Zn-based oxide, a large group can be formed using not only the medium group in FIG. 9A but also a medium group in which the arrangement of the In atom, the Ga atom, and the Zn atom is different from that in FIG. 9A.

Specifically, when the large group illustrated in FIG. 9B is repeated, a crystal of an In—Ga—Zn-based oxide can be obtained. Note that a layered structure of the In—Ga—Zn-based oxide can be expressed as a composition formula, $InGaO_3(ZnO)_n$ (n is a natural number).

Figure 10A:
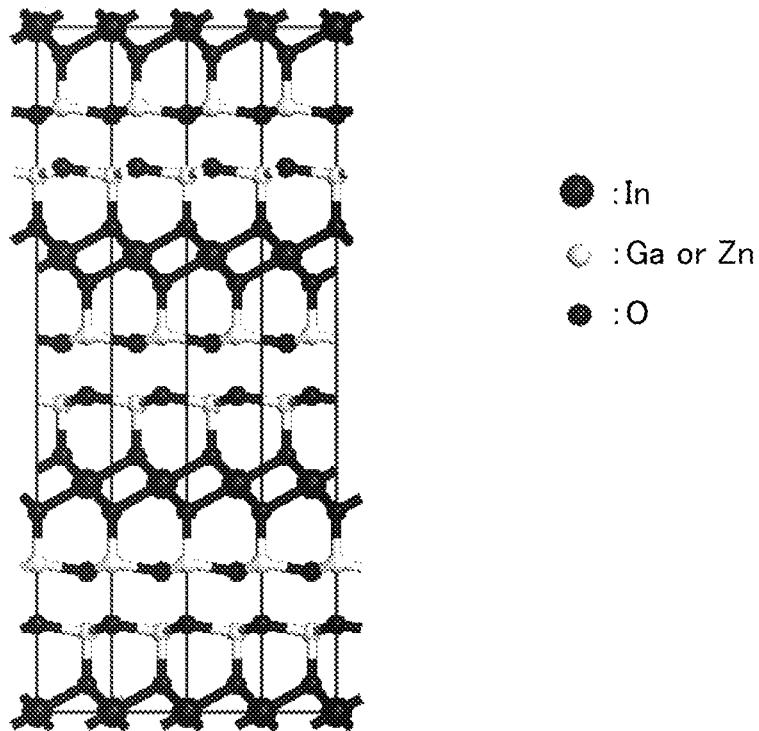
FIGS. 10A and 10B illustrate structural examples of CAAC.

In the case of n=1 ($InGaZnO_4$), a crystal structure illustrated in FIG. 10A can be obtained, for example. Since Ga and In can have five ligands, as described with reference to FIG. 7B, the crystal structure can alternatively be a structure in which Ga in the crystal structure in FIG. 10A is replaced with In.

Figure 10B:
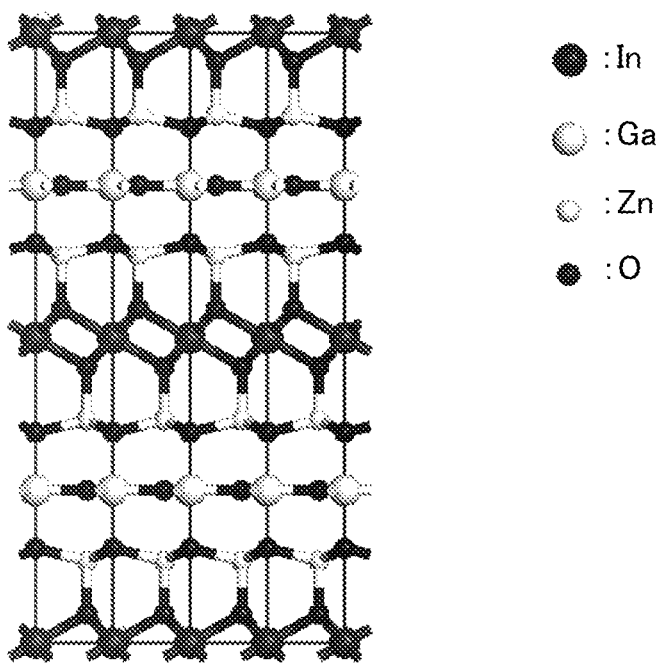

In the case of n=2 ($InGaZn_2O_5$), a crystal structure illustrated in FIG. 10B can be obtained, for example. Since Ga and In can have five ligands, as described with reference to FIG. 7B, the crystal structure can alternatively be a structure in which Ga in the crystal structure in FIG. 10B is replaced with In.

The above is the examples of the structure of the CAAC. An oxide semiconductor with crystallinity, such as the CAAC, has fewer defects than an amorphous oxide semiconductor.

The regions 604a_a, 604b_a, 604a_b, and 604b_b illustrated in FIGS. 6A and 6B are doped with the dopant and function as a source and a drain of the transistor. As the dopant, at least one of elements of Group 13 in the periodic table (e.g., boron), elements of Group 15 in the periodic table (e.g., one or more of nitrogen, phosphorus, and arsenic), and rare gas elements (e.g., one or more of helium, argon, and xenon) can be used, for example. A region functioning as a source of the transistor can be called source region, and a region functioning as a drain of the transistor can be called drain region. Addition of the dopant to the regions 604a_a, 604b_a, 604a_b, and 604b_b can reduce the resistance between the regions and the conductive layers; thus, the transistor can be downsized.

The conductive layers 605a_a, 605b_a, 605a_b, and 605b_b function as the source or the drain of the transistor. Note that a layer functioning as a source of the transistor can be called source electrode or source wiring, and a layer functioning as a drain of the transistor can be called drain electrode or drain wiring.

The conductive layers 605a_a, 605b_a, 605a_b, and 605b_b can be formed using, for example, a layer of a metal material such as aluminum, magnesium, chromium, copper, tantalum, titanium, molybdenum, or tungsten or an alloy material containing any of the above metal materials as a main component. For example, the conductive layers 605a_a, 605b_a, 605a_b, and 605b_b can be formed using a layer of an alloy material containing copper, magnesium, and aluminum. Moreover, the conductive layers 605a_a, 605b_a, 605a_b, and 605b_b can be a stack of materials applicable to these conductive layers. For example, the conductive layers 605a_a, 605b_a, 605a_b, and 605b_b can be formed using a stack including a layer of an alloy material containing copper, magnesium, and aluminum and a layer containing copper.

Alternatively, the conductive layers 605a_a, 605b_a, 605a_b, and 605b_b can be a layer containing a conductive metal oxide. Examples of the conductive metal oxide include indium oxide, tin oxide, zinc oxide, indium oxide-tin oxide, and indium oxide-zinc oxide. Note that silicon oxide may be contained in the conductive metal oxide applicable to the conductive layers 605a_a, 605b_a, 605a_b, and 605b_b.

As the insulating layers 606a and 606b, a layer of a material applicable to the insulating layers 602_a and 602_b can be used, for example. Alternatively, the insulating layers 606a and 606b can be formed using a stack of materials applicable to the insulating layers 606a and 606b.

The insulating layer 607 functions as a protective insulating layer for preventing impurities from entering the transistor.

As the insulating layer 607, a layer of a material applicable to the insulating layers 602_a and 602_b can be used, for example. Alternatively, the insulating layer 607 can be formed using a stack of materials applicable to the insulating layer 607. For example, insulating layer 607 may be formed using a silicon oxide layer, an aluminum oxide layer, or the like. For example, the use of an aluminum oxide layer as the insulating layer 607 can more effectively prevent impurities from entering the semiconductor layer 603_b and effectively prevent the semiconductor layer 603_b from releasing oxygen.

Note that the transistor in this embodiment may have a structure in which an insulating layer is provided over part of the oxide semiconductor layer serving as a channel formation layer and a conductive layer serving as a source or a drain is provided to overlap with the oxide semiconductor layer with the insulating layer placed therebetween. In that case, the insulating layer functions as a layer protecting the channel formation layer of the transistor (also referred to as channel protective layer). As the insulating layer functioning as a channel protective layer, a layer containing a material applicable to the insulating layers 602_a and 602_b can be used, for example. Alternatively, the insulating layer functioning as a channel protective layer may be a stack of materials applicable to the insulating layers 602_a and 602_b.

Further, base layers may be formed over the element formation layers 600_a and 600_b and the transistors may be formed over the base layers. In that case, the base layer can be a layer of a material applicable to the insulating layers 602_a and 602_b, for example. Alternatively, the base layer may be a stack of materials applicable to the insulating layers 602_a and 602_b. For example, a stack of an aluminum oxide layer and a silicon oxide layer used as the base layer can prevent oxygen in the base layer from being released through the semiconductor layers 603_a and 603_b.

Next, as an example of a method of manufacturing the transistor in this embodiment, an example of a method of manufacturing the transistor in FIG. 6A will be described with reference to FIGS. 11A to 11E. FIGS. 11A to 11E are schematic cross-sectional views illustrating a method of manufacturing the transistor in FIG. 6A.

Figure 11A:
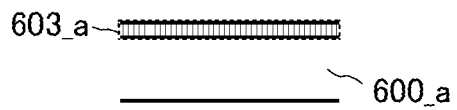
FIGS. 11A to 11E illustrate an example of a method of manufacturing a transistor.

First, as illustrated in FIG. 11A, the element formation layer 600_a is prepared, and the semiconductor layer 603_a is formed over the element formation layer 600_a.

For example, a film of an oxide semiconductor material applicable to the semiconductor layer 603_a (such a film is also referred to as oxide semiconductor film) is formed by sputtering, thereby forming the semiconductor layer 603_a. Note that the oxide semiconductor film may be partly etched after the deposition. Moreover, the oxide semiconductor film may be formed in a rare gas atmosphere, an oxygen atmosphere, or a mixed atmosphere of a rare gas and oxygen.

The oxide semiconductor film may be formed using, as a sputtering target, an oxide target having a composition ratio of In:Ga:Zn=1:1:1, 4:2:3, 3:1:2, 1:1:2, 2:1:3, or 3:1:4 (in an atomic ratio). The oxide target having any of the above composition ratios enables formation of a highly crystalline oxide semiconductor film, and facilitates formation of polycrystals or CAAC's.

In addition, the oxide semiconductor film may be formed using, as the sputtering target, an oxide target having a composition ratio of In:Sn:Zn=1:2:2, 2:1:3, 1:1:1, or 20:45:35 (in an atomic ratio). The oxide target having any of the above composition ratios enables formation of a highly crystalline oxide semiconductor film, and facilitates formation of polycrystals or CAAC's.

Furthermore, an In—Zn-based oxide film may be formed using, as the sputtering target, an oxide target having a composition ratio of In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), further preferably In:Zn=15:1 to 1.5:1 ($In_2O_3$:ZnO=15:2 to 3:4 in a molar ratio). Furthermore, when the atomic ratio of the target used for forming the In—Zn-based oxide semiconductor film is expressed by In:Zn:O=S:U:R, R>1.5S+U is satisfied. The increase in In content makes the field-effect mobility (also simply referred to as mobility) of the transistor higher.

In the case of using a sputtering method, the semiconductor layer 603_a is formed in a rare gas (typically argon) atmosphere, an oxygen atmosphere, or a mixed atmosphere of a rare gas and oxygen, for example. In that case, when the semiconductor layer 603_a is formed in a mixed atmosphere of a rare gas and oxygen, the oxygen content is preferably higher than the rare gas content.

When the film is formed by sputtering, it is preferable to sufficiently suppress leakage from the outside of a deposition chamber and degasification through an inner wall of the deposition chamber so that impurities such as hydrogen, water, a hydroxyl group, or hydride (also referred to as hydrogen compound) are not included in a deposited film.

For example, before the film is formed by sputtering, preheat treatment may be performed in a preheating chamber of a sputtering apparatus. By the preheat treatment, the above impurities can be eliminated.

Before the film is formed by sputtering, for example, it is possible to perform treatment by which voltage is applied to a substrate side, not to a target side, in an argon, nitrogen, helium, or oxygen atmosphere with the use of an RF power source and plasma is generated so that a surface of the substrate on which the film is to be formed is modified (such treatment is also referred to as reverse sputtering). With reverse sputtering, powdery substances (also referred to as particles or dust) attached to the surface where the film is to be formed can be removed.

In the case where the film is formed by sputtering, moisture remaining in the deposition chamber for forming the film can be removed by an entrapment vacuum pump or the like. As the entrapment vacuum pump, a cryopump, an ion pump, or a titanium sublimation pump can be used, for example. Alternatively, moisture remaining in the deposition chamber can be removed by a turbo molecular pump provided with a cold trap. With the use of the vacuum pump, back flow of the exhaust including the impurities can be reduced.

When a high-purity gas from which the above impurities are removed is used as a sputtering gas, for example, the impurity concentration of the deposited film can be lowered. For instance, a gas with a dew point of −70° C. or lower is preferably used as a sputtering gas.

The oxide semiconductor film may alternatively be formed by, instead of a sputtering method, a vacuum evaporation method, a plasma-enhanced chemical vapor deposition (PECVD) method, a pulsed laser deposition (PLD) method, an atomic layer deposition (ALD) method, a molecular beam epitaxy (MBE) method, or the like.

In the example of the method of manufacturing the transistor in this embodiment, a layer is formed by etching part of a film in the following manner, for instance: a resist mask is formed over part of the film by a photolithography process and the film is etched using the resist mask, thereby forming the layer. Note that in this case, the resist mask is removed after the layer is formed.

When an oxide semiconductor layer containing the CAAC is formed as the semiconductor layer 603_a the oxide semiconductor film is formed by sputtering while the temperature of the element formation layer where the oxide semiconductor film is formed ranges from 100° C. to 600° C., preferably from 150° C. to 550° C., more preferably from 200° C. to 500° C. The oxide semiconductor film is deposited while the temperature of the element formation layer is high, whereby the impurity concentration in the film is reduced, the field-effect mobility of the transistor to be manufactured can be increased, and the gate-bias stress stability can be increased. Further, the atomic arrangement in the oxide semiconductor film is ordered, the density thereof is increased, so that a polycrystal or a CAAC is easily formed. Furthermore, a polycrystal or CAAC is also more easily formed by film deposition in an oxygen gas atmosphere because an unnecessary atom such as a rare gas does not enter the film. Note that a mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %. As the oxide semiconductor film is thinner, the short channel effect of the transistor can be reduced.

In that case, the element formation layer 600_a is preferably flat. For example, the average surface roughness of the element formation layer 600_a is preferably 1 nm or less, further preferably 0.3 nm or less. By making the element formation layer 600_a flatter, the mobility of the CAAC oxide semiconductor can be made higher than that of an amorphous oxide semiconductor. For example, the element formation layer 600_a can be flattened by at least one of chemical mechanical polishing (CMP) and plasma treatment. Here, plasma treatment includes treatment for performing sputtering on a surface with rare gas ions and treatment for performing etching on a surface with an etching gas.

Figure 11B:
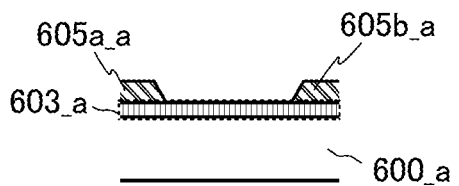

Then, as illustrated in FIG. 11B, the conductive layers 605a_a and 605b_a are formed over the semiconductor layer 603_a.

For example, a film of a material applicable to the conductive layers 605a_a and 605b_a is formed as a first conductive film by sputtering, and the first conductive film is partly etched, thereby forming the conductive layers 605a_a and 605b_a.

Figure 11C:
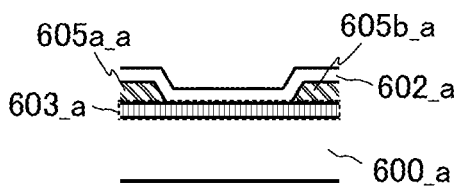

Next, as illustrated in FIG. 11C, the insulating layer 602_a is formed in contact with the semiconductor layer 603_a.

For example, the insulating layer 602_a can be formed by depositing a film applicable to the insulating layer 602_a by sputtering in a rare gas (typically argon) atmosphere, an oxygen atmosphere, or a mixed atmosphere of a rare gas and oxygen. The temperature of the element formation layer 600_a at the time when the insulating layer 602_a is formed preferably ranges from room temperature to 300° C.

Before the formation of the insulating layer 602_a, plasma treatment with the use of a gas such as $N_2O$, $N_2$, or Ar may be performed to remove water or the like adsorbed on an exposed surface of the semiconductor layer 603_a. In the case where the plasma treatment is performed, the insulating layer 602_a is preferably formed after the plasma treatment without exposure to air.

Figure 11D:
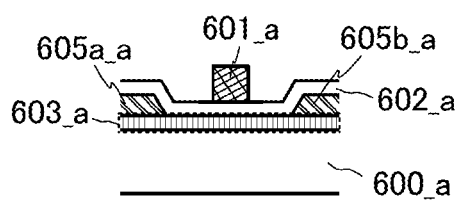

Next, as illustrated in FIG. 11D, the conductive layer 601_a is formed over the insulating layer 602_a.

For example, a film of a material applicable to the conductive layer 601_a is formed as a second conductive film by sputtering, and the second conductive film is partly etched, thereby forming the conductive layer 601_a.

Further, in the example of the method of manufacturing the transistor in FIG. 6A, heat treatment is performed, for example, at higher than or equal to 600° C. and lower than or equal to 750° C., or higher than or equal to 600° C. and lower than the strain point of the substrate. For example, the heat treatment is performed after the oxide semiconductor film is formed, after the oxide semiconductor film is partly etched, after the first conductive film is formed, after the first conductive film is partly etched, after the insulating layer 602_a is formed, after the second conductive film is formed, or after the second conductive film is partly etched. The heat treatment eliminates impurities such as hydrogen, water, a hydroxyl group, or hydride from the semiconductor layer 603_a.

Note that a heat treatment apparatus for the heat treatment can be an electric furnace or an apparatus for heating an object by heat conduction or heat radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, a rare gas or an inert gas (e.g., nitrogen) which does not react with the object by the heat treatment can be used.

Further, after the heat treatment is performed and while the heating temperature is being maintained or being decreased, a high-purity oxygen gas, a high-purity $N_2O$ gas, or ultra-dry air (having a dew point −40° C. or lower, preferably −60° C. or lower) may be introduced in the furnace where the heat treatment has been performed. It is preferable that the oxygen gas or the $N_2O$ gas do not contain water, hydrogen, and the like. The purity of the oxygen gas or the $N_2O$ gas which is introduced into the heat treatment apparatus is preferably 6N or higher, further preferably 7N or higher; that is, the impurity concentration of the oxygen gas or the $N_2O$ gas is preferably 1 ppm or lower, further preferably 0.1 ppm or lower. By the action of the oxygen gas or the $N_2O$ gas, oxygen is supplied to the semiconductor layer 603_a, and defects due to oxygen vacancy in the semiconductor layer 603_a can be reduced. Note that the high-purity oxygen gas, high-purity $N_2O$ gas, or ultra-dry air may be introduced during the heat treatment.

In the example of the method of manufacturing the transistor in FIG. 6A, oxygen may be implanted into the oxide semiconductor film with a method of accelerating oxygen ions by electric fields, such as oxygen doping using oxygen plasma, after the semiconductor layer 603_a is formed, after the conductive layers 605a_a and 605b_a are formed, after the insulating layer 602_a is formed, after the conductive layer 601_a is formed, or after the heat treatment is performed. For example, oxygen doping using a high-density plasma of 2.45 GHz may be performed. Alternatively, oxygen doping may be performed by an ion implantation method. The oxygen doping can reduce variations in electrical characteristics of transistors to be manufactured. For example, the oxygen doping is performed so that the insulating layer 602_a contains oxygen with a higher proportion than that in the stoichiometric composition.

When the insulating layer in contact with the semiconductor layer 603_a contains an excessive content of oxygen, oxygen is easily supplied to the semiconductor layer 603_a.

Thus, oxygen defects in the semiconductor layer 603_a, or at the interface between the insulating layer 602_a and the semiconductor layer 603_a can be reduced, which results in further reduction in the carrier concentration of the semiconductor layer 603_a. This embodiment is not limited to the above; even if an excessive amount of oxygen is contained in the semiconductor layer 603_a through the manufacturing process, the insulating layer in contact with the semiconductor layer 603_a can prevent oxygen from being released from the semiconductor layer 603_a.

For example, when an insulating layer containing gallium oxide is formed as the insulating layer 602_a, the composition of gallium oxide can be set to be $Ga_2O_x$ by supplying the insulating layer with oxygen.

When an insulating layer containing aluminum oxide is formed as the insulating layer 602_a, the composition of aluminum oxide can be set to be $Al_2O_x$ by supplying the insulating layer with oxygen.

Further, when an insulating layer containing gallium aluminum oxide or aluminum gallium oxide is formed as the insulating layer 602_a, the composition of gallium aluminum oxide or aluminum gallium oxide can be set to be $Ga_xAl_{2-x}O_{3+\alpha}$ by supplying the insulating layer with oxygen.

Through the above steps, impurities such as hydrogen, water, a hydroxyl group, or hydride (hydrogen compound) are removed from the semiconductor layer 603_a and oxygen is supplied to the semiconductor layer 603_a; thus, the oxide semiconductor layer can be highly purified.

In addition to the heat treatment, after the insulating layer 602_a is formed, heat treatment (preferably at 200° C. to 600° C., for example, at 250° C. to 350° C.) may be performed in an inert gas atmosphere or an oxygen gas atmosphere.

The heating temperature of the element formation layer 600_a or the temperature of the heat treatment after the deposition of the oxide semiconductor film is 150° C. or higher, preferably 200° C. or higher, further preferably 400° C. or higher. When the heat treatment after the oxide semiconductor film is deposited is performed at 300° C. or higher, impurities such as hydrogen contained in the film can be released and removed (the film can be dehydrated or dehydrogenated).

The heat treatment can be performed in an oxygen atmosphere; alternatively, the following two steps may be performed: the above dehydration or dehydrogenation is performed under a nitrogen atmosphere or a reduced pressure and then thermal treatment is performed in an oxygen atmosphere. By performing thermal treatment in an atmosphere including oxygen after the dehydration or dehydrogenation, oxygen can be added to the oxide semiconductor, so that the effect of the heat treatment can be further enhanced. Moreover, as the treatment for supplying oxygen, thermal treatment may be performed while the insulating layer is placed in contact with the oxide semiconductor layer. A defect due to oxygen vacancy is easily caused in the oxide semiconductor layer or at the interface between the oxide semiconductor layer and a layer stacked over the oxide semiconductor layer, for example; however, when excess oxygen is included in the oxide semiconductor by the heat treatment, oxygen vacancy caused constantly can be compensated for by excess oxygen. The excess oxygen is mainly oxygen existing between lattices. By setting the concentration of oxygen in the range of $1\times10^{16}/cm^3$ to $2\times10^{20}/cm^3$, oxygen can be included in the oxide semiconductor layer without causing crystal distortion or the like even if the oxide semiconductor layer is crystallized, for example.

The heat treatment performed after the formation of the oxide semiconductor film can increase the gate-bias stress stability of the transistor to be manufactured, and can increase the field-effect mobility of the transistor.

Figure 11E:
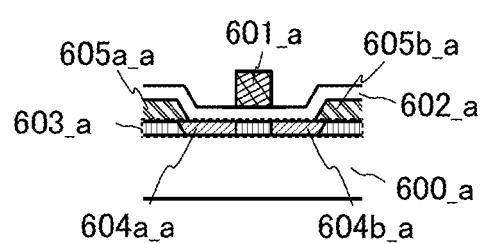

Then, as illustrated in FIG. 11E, a dopant is added to the semiconductor layer 603_a, from a side on which the conductive layer 601_a is formed, so that the region 604a_a and the region 604b_a are formed in a self-aligned manner through the insulating layer 602_a.

For example, the dopant can be added by an ion doping apparatus or an ion implantation apparatus.

Note that the given example of the method of manufacturing the transistor is not necessarily applied only to the transistor in FIG. 6A. For example, the above description of the example of the method of manufacturing the transistor in FIG. 6A can be applied as appropriate to the components in FIG. 6B which have the same designations as the components in FIG. 6A and have a function at least partly the same as that of the components in FIG. 6A.

As described with reference to FIGS. 6A and 6B, FIGS. 7A to 7E, FIGS. 8A to 8C, FIGS. 9A to 9C, FIGS. 10A and 10B, and FIGS. 11A to 11E, each example of the transistor in this embodiment includes a conductive layer functioning as a gate; an insulating layer functioning as a gate insulating layer; an oxide semiconductor layer in which a channel is formed and which overlaps with the conductive layer functioning as the gate with the insulating layer functioning as the gate insulating layer placed therebetween; a conductive layer that is electrically connected to the oxide semiconductor layer and functions as one of a source and a drain; and a conductive layer that is electrically connected to the oxide semiconductor layer and functions as the other of the source and the drain.

In the transistor in the example of this embodiment, the carrier concentration of the oxide semiconductor layer can be lower than $1\times10^{14}/cm^3$, preferably lower than $1\times10^{12}/cm^3$, more preferably lower than $1\times10^{11}/cm^3$.

The carrier concentration of an oxide semiconductor applied to the transistor is preferably $10^{18}/cm^3$ or lower. An oxide semiconductor containing In or Zn can have a carrier concentration of $10^{18}/cm^3$ or lower by performing high purification of the oxide semiconductor film (removal of hydrogen and the like) or heat treatment after the deposition as described above, as well as by containing Ga or Sn as its component.

By performing at least one of the heat treatment during the deposition of the oxide semiconductor film and the heat treatment after the deposition, the threshold voltage of the transistor can be positively shifted to make the transistor normally off, and the off-state current per micrometer of channel width can be 10 aA ($1\times10^{-17}$ A) or less, 1 aA ($1\times10^{-18}$ A) or less, 10 zA ($1\times10^{-20}$ A) or less, 1 zA ($1\times10^{-21}$ A) or less, and even 100 yA ($1\times10^{-22}$ A) or less. It is preferable that the off-state current of the transistor be as low as possible; the lower limit of the off-state current of the transistor in this embodiment is estimated to be about $10^{-30}$ A/μm.

With the use of the transistor including the oxide semiconductor layer in this embodiment as the transistor for controlling the potential of the output signal in any of the arithmetic circuit in the above embodiments for example, a data retention period of the arithmetic circuit can be prolonged.

The transistor in the example of this embodiment and another transistor, for example, a transistor including a semiconductor layer containing a semiconductor belonging to Group 14 of the periodic table (e.g., silicon) can be stacked. Thus, the circuit area can be reduced while the transistor including the oxide semiconductor layer and the another transistor can be formed over one substrate.

The transistor including the oxide semiconductor can have relatively high field-effect mobility regardless of whether the oxide semiconductor is amorphous or crystalline. Such an increase in field-effect mobility might be attributed not only to removal of impurities by dehydration or dehydrogenation but also to a reduction in interatomic distance due to an increase in density. Moreover, the oxide semiconductor film can be crystallized by being purified by removal of impurities from the oxide semiconductor film. For example, the field-effect mobility of a transistor including an In—Sn—Zn-based oxide semiconductor can be higher than 31 cm$^2$/V·s, preferably higher than 39 cm$^2$/V·s, further preferably higher than 60 cm$^2$/V·s. It has been proposed that ideally, a highly purified non-single-crystal oxide semiconductor can achieve a field-effect mobility exceeding 100 cm$^2$/V·s. In addition, the example of the transistor in this embodiment indicates that the field-effect mobility thereof is increased as the defect density of the oxide semiconductor layer decreases. The reason therefor will be given below.

The actually measured field-effect mobility of a field-effect transistor, which is not limited to one including an oxide semiconductor layer, is lower than its inherent mobility for a variety of reasons. One of causes for reduction in the field-effect mobility is a defect in a semiconductor layer or a defect at an interface between the semiconductor layer and an insulating layer. For example, with a Levinson model, the field-effect mobility of a transistor based on the assumption that no defect exists inside an oxide semiconductor layer can be calculated theoretically.

Assuming a potential barrier (such as a grain boundary) exists in a semiconductor layer, the measured field-effect mobility of the semiconductor layer, denoted by μ, is expressed by Formula 1 where the inherent field-effect mobility of the semiconductor layer is $\mu_0$.

[FORMULA 1]

$$\mu = \mu_0 \exp\left(-\frac{E}{kT}\right) \quad (1)$$

In Formula 1, E denotes the height of the potential barrier, k denotes the Boltzmann constant, and T denotes the absolute temperature. Further, on the assumption that the potential barrier is attributed to a defect, the height of the potential barrier E can be expressed by Formula 2 according to the Levinson model.

[FORMULA 2]

$$E = \frac{e^2 N^2}{8\varepsilon n} = \frac{e^3 N^2}{8\varepsilon C_{ox} V_g} \quad (2)$$

In Formula 2, e denotes the elementary charge, N denotes the average defect density per unit area in a channel, ε denotes the permittivity of the semiconductor, n denotes the carrier concentration per unit area in the channel, $C_{ox}$ denotes the capacitance per unit area, $V_g$ denotes the gate voltage (voltage between a gate and a source), and t denotes the thickness of the channel. In the case where the thickness of the semiconductor layer is less than or equal to 30 nm, the thickness of the channel can be regarded as being the same as the thickness of the semiconductor layer. In addition, the drain current $I_d$ (current between a drain and the source) in a linear region is expressed by Formula 3.

[FORMULA 3]

$$I_d = \frac{W\mu V_g V_d C_{ox}}{L} \exp\left(-\frac{E}{kT}\right) \quad (3)$$

In Formula 3, L denotes the channel length and W denotes the channel width, and L and W are each 10 μm in this example. Moreover, $V_d$ denotes the drain voltage. Both sides of Formula 3 are divided by $V_g$ and then logarithms of both the sides are taken, resulting in Formula 4.

[FORMULA 4]

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g} \quad (4)$$

The right side of Formula 4 is a function of $V_g$. From Formula 4, it is found that the defect density N can be obtained from a line in a graph that is obtained by plotting actual measured values with $\ln(I_d/V_g)$ as the ordinate and $1/V_g$ as the abscissa. That is, the defect density can be evasluated from the $I_d$-$V_g$ characteristics of the transistor. For example, the defect denity N of an oxide semiconductor film containing indium (In), gallium (Ga), and zinc (Zn) in a 1:1:1 atomic ratio is about $1\times10^{12}$/cm$^2$.

On the basis of the defect density or the like obtained in the above manner, $\mu_0$, the inherent field-effect mobility of the oxide semiconductor layer, is calculated to be 120 cm$^2$/V·s. In general, the measured field-effect mobility of an In—Ga—Zn-based oxide having a defect is about 40 cm$^2$/V·s; however, assuming that no defect exists inside the oxide semiconductor and at the interface between the oxide semiconductor and an insulating film, the mobility $\mu_0$ of the oxide semiconductor is expected to be 120 cm$^2$/V·s. It is thus found that the mobility of the oxide semiconductor and the field-effect mobility of the transistor are increased as defects are decreased. For example, an oxide semiconductor layer containing the CAAC or the like has low defect density.

Note that even when no defect exists inside the semiconductor layer, scattering at an interface between a channel and a gate insulating layer affects the transport property of the transistor. In other words, the mobility $\mu_1$ at a position that is a distance x away from the interface between the channel and the gate insulator is expressed by Formula 5.

[FORMULA 5]

$$\frac{1}{\mu_1} = \frac{1}{\mu_0} + \frac{D}{B}\exp\left(-\frac{x}{l}\right) \quad (5)$$

In Formula 5, D denotes the electric field in the gate direction, and B and l are constants. The values of B and l can be obtained from actual measurement results; according to the above measurement results, B is $2.38\times10^7$ cm/s and l is 10 nm (the depth to which the influence of interface scattering reaches). In Formula 5, the second term is increased as D increases (i.e., as the gate voltage increases); accordingly, the mobility $\mu_1$ is decreased as D increases.

Figure 12:
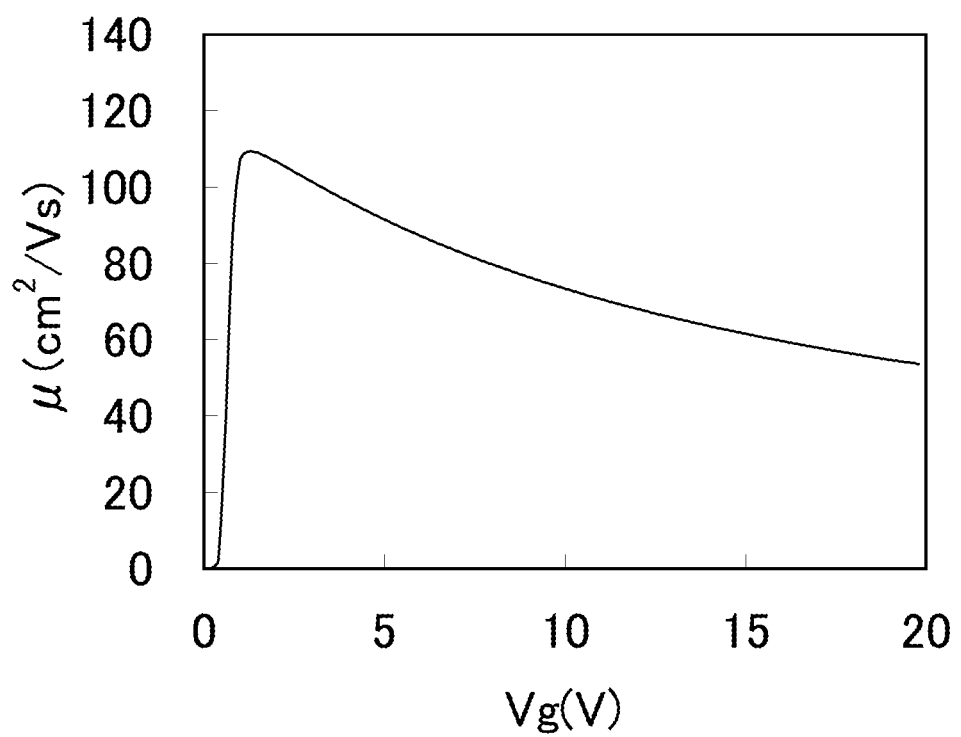
FIG. 12 is a graph for showing the relation between defect density in an oxide semiconductor layer and field-effect mobility of a transistor.

FIG. 12 shows calculation results of the mobility $\mu_2$ of a transistor whose channel is formed in an ideal oxide semiconductor layer with no defect therein. For the calculation, Sentaurus Device, the software manufactured by Synopsys, Inc., is used. For the calculation, the band gap, the electron affinity, the relative permittivity, and the thickness of the oxide semiconductor layer are 2.8 eV, 4.7 eV, 15, and 15 nm, respectively. The work functions of a gate, a source, and a drain of the transistor are 5.5 eV, 4.6 eV, and 4.6 eV, respectively. The thickness of a gate insulating layer is 100 nm, and the relative permittivity thereof is 4.1. The channel length and the channel width of the transistor are each 10 μm, and the drain voltage $V_d$ is 0.1 V.

As shown in FIG. 12, the field-effect mobility is as high as 100 cm²/V·s or more at a gate voltage $V_g$ around 1 V, and decreases as the gate voltage $V_g$ becomes higher because the influence of interface scattering is increased. In order to reduce interface scattering, it is preferable that a surface of the semiconductor layer be flat at the atomic level (i.e., atomic layer flatness).

The following shows the calculation results of electrical characteristics of a minute transistor using an oxide semiconductor having the above-described high field-effect mobility.

Figure 13A:
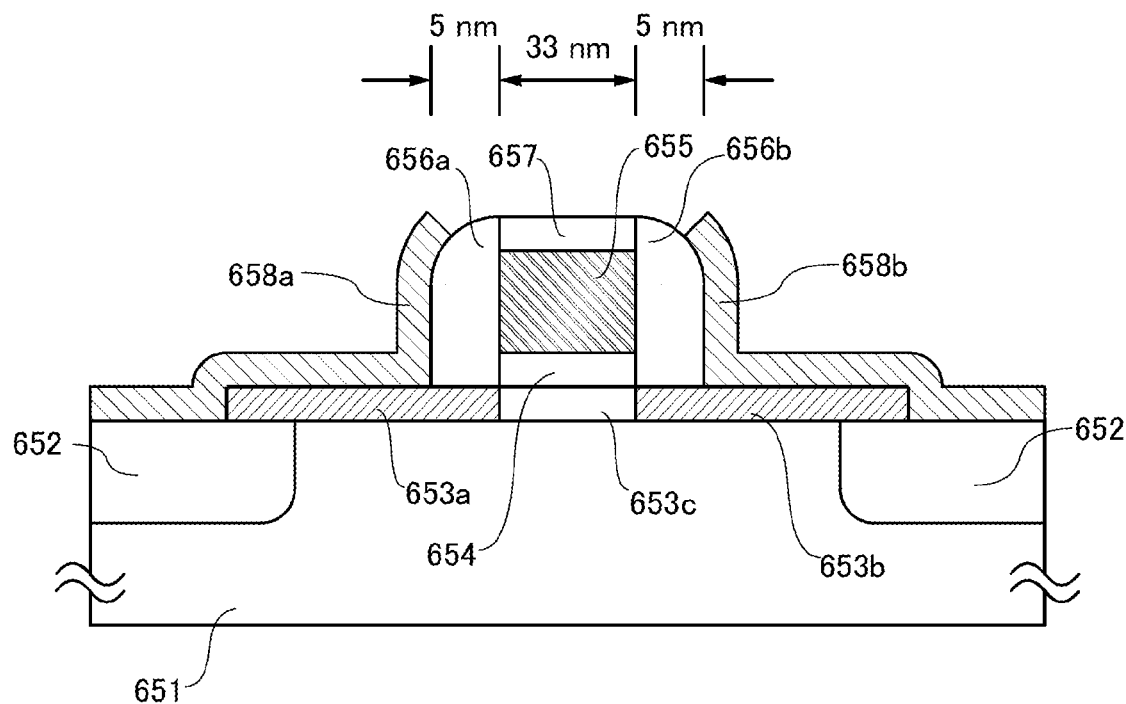
FIGS. 13A and 13B illustrate cross-sectional structural examples of a transistor.
Figure 13B:
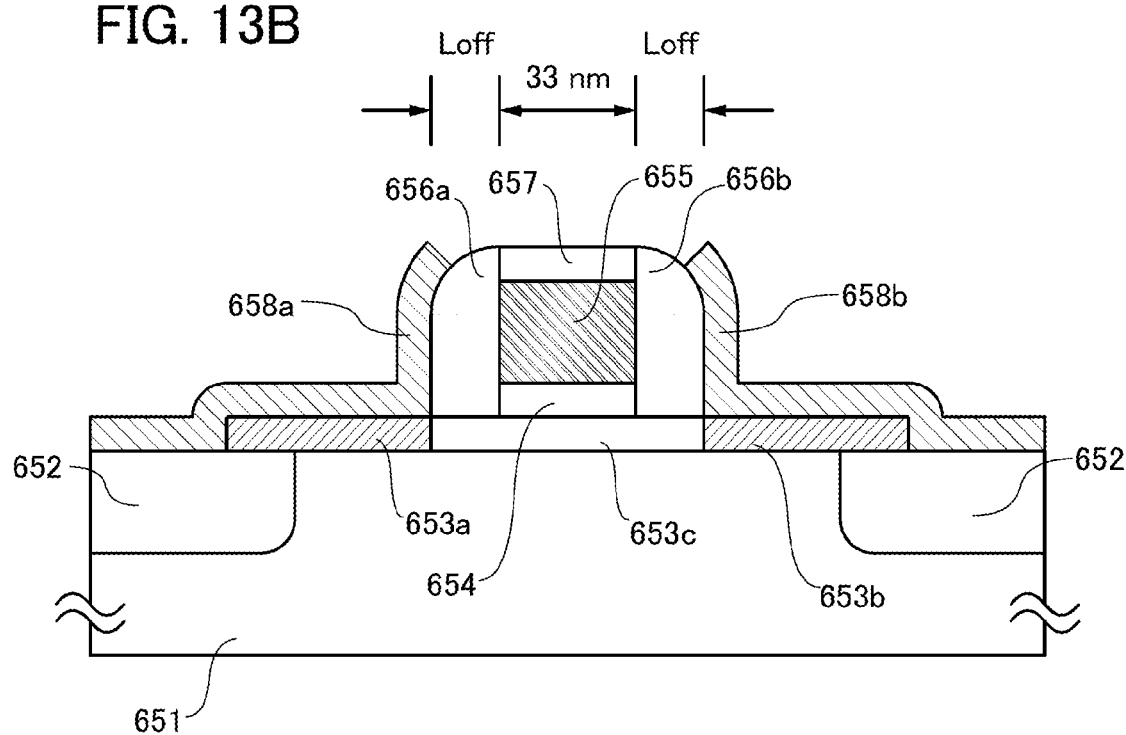

FIGS. 13A and 13B show cross-sectional structures of transistors used for the calculation. The transistors illustrated in FIGS. 13A and 13B each include n-type semiconductor regions 653a and 653b and a semiconductor region 653c in an oxide semiconductor layer. The resistivity of the semiconductor regions 653a and 653b is 2×10⁻³ Ω·cm.

The transistor in FIG. 13A is provided over a base insulator 651 and a buried insulator 652. The buried insulator 652 is formed using aluminum oxide and provided to be embedded in the base insulator 651. The buried insulator 652 allows oxygen to be easily supplied to the semiconductor region 653c.

The transistor in FIG. 13A includes the semiconductor region 653a, the semiconductor region 653b, the semiconductor region 653c, a gate insulating layer 654, a gate electrode 655, a sidewall insulator 656a, a sidewall insulator 656b, an insulating layer 657, a source electrode 658a, and a drain electrode 658b.

The semiconductor region 653c is positioned between the semiconductor region 653a and the semiconductor region 653b. The semiconductor region 653c is an intrinsic semiconductor region serving as a channel formation region.

The gate electrode 655 is provided over the gate insulating layer 654. The width of the gate electrode 655 is 33 nm.

The sidewall insulators 656a and 656b are provided in contact with side surfaces of the gate electrode 655. In the transistor in FIG. 13A, a semiconductor region below the sidewall insulator 656a is included in the n-type semiconductor region 653a, and a semiconductor region below the sidewall insulator 656b is included in the n-type semiconductor region 653b. The width of the sidewall insulators 656a and 656b is 5 nm.

The insulating layer 657 is provided over the gate electrode 655. The insulating layer 657 has a function of preventing a short circuit between the gate electrode 655 and a wiring.

The source electrode 658a is in contact with the semiconductor region 653a.

The drain electrode 658b is in contact with the semiconductor region 653b.

Note that the channel width of the transistor in FIG. 13A is 33 nm.

The transistor in FIG. 13B differs from the transistor in FIG. 13A in the conductivity type of the semiconductor regions below the sidewall insulators 656a and 656b. In the transistor in FIG. 13B, the semiconductor regions below the sidewall insulators 656a and 656b are included in the intrinsic semiconductor region 653c. In other words, the transistor in FIG. 13B includes regions where the semiconductor region 653a and the gate electrode 655 do not overlap with each other and the semiconductor region 653c and the gate electrode 655 do not overlap with each other. These regions are called offset regions, and their width is called offset length ($L_{off}$). In FIG. 13B, the offset length is the same as the width of the sidewall insulators 656a and 656b.

Note that the other parameters used in calculation are as described above. For the calculation, Sentaurus Device, the software manufactured by Synopsys, Inc., is used.

Figure 14A:
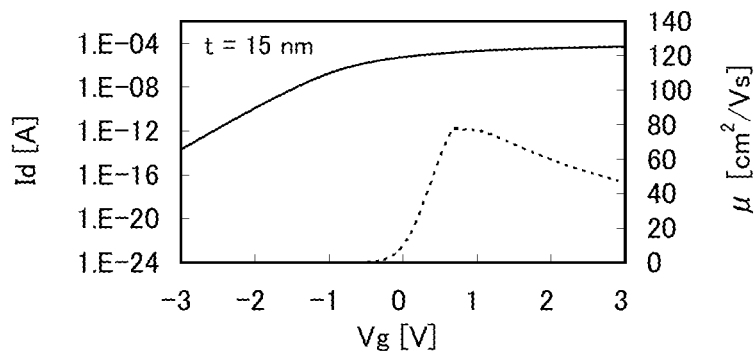
FIGS. 14A to 14C show the result of calculation of electrical characteristics of transistors.
Figure 14B:
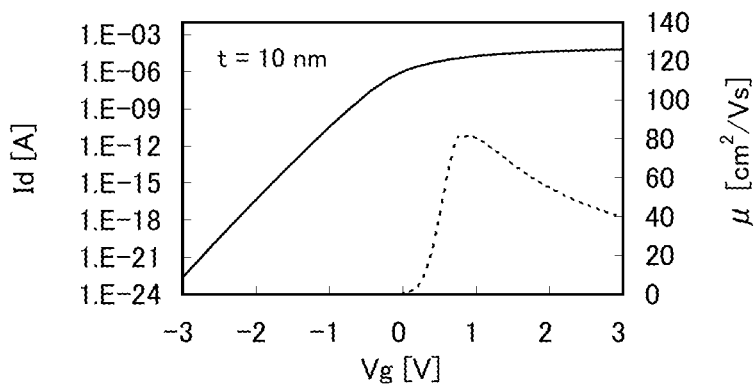
Figure 14C:
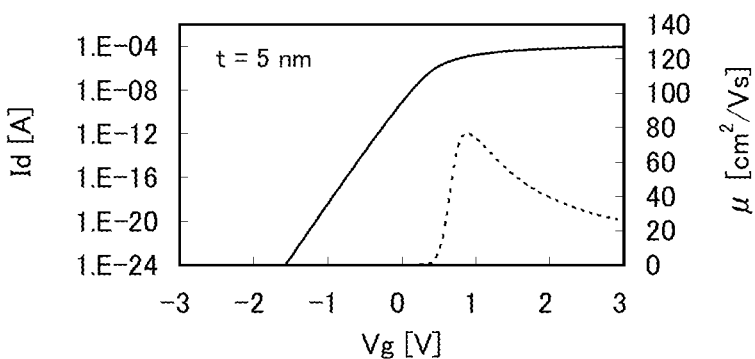

FIGS. 14A to 14C show the gate voltage ($V_g$: a potential difference between the gate and the source) dependence of the drain current $I_d$ (indicated by a solid line) and the field-effect mobility μ (indicted by a dotted line) of the transistor having the structure in FIG. 13A. The drain current $I_d$ is calculated under the assumption that the drain voltage $V_d$ (potential difference between the drain and the source) is +1 V, and the field-effect mobility μ is calculated under the assumption that the drain voltage is +0.1 V.

FIG. 14A shows the gate voltage dependence of the transistor including the gate insulating layer 654 with a thickness of 15 nm. FIG. 14B shows the gate voltage dependence of the transistor including the gate insulating layer 654 with a thickness of 10 nm. FIG. 14C shows the gate voltage dependence of the transistor including the gate insulating layer 654 with a thickness of 5 nm. As shown in FIGS. 14A to 14C, as the gate insulating layer 654 is thinner, the drain current $I_d$ in the off state (off-state current) in particular is significantly decreased. In contrast, there is no remarkable tendency in the peak value of the field-effect mobility μ and the drain current $I_d$ in the on state (on-state current). Further, the drain current exceeds 10 μA, which is needed in a storage circuit and the like, at a gate voltage around 1 V.

Figure 15A:
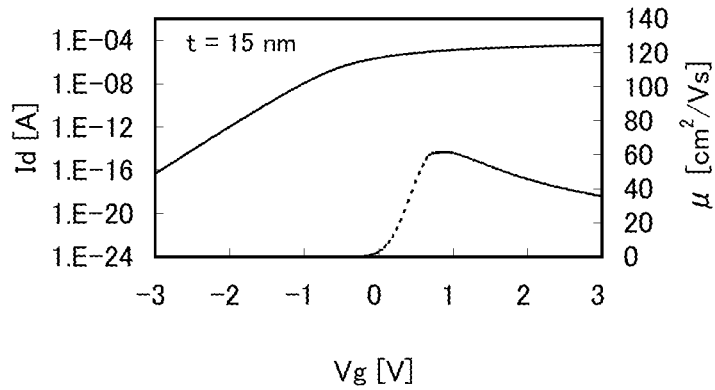
FIGS. 15A to 15C show the result of calculation of electrical characteristics of transistors.
Figure 15B:
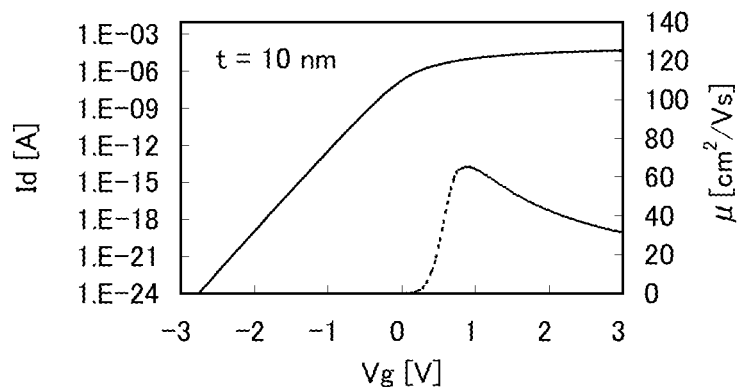
Figure 15C:
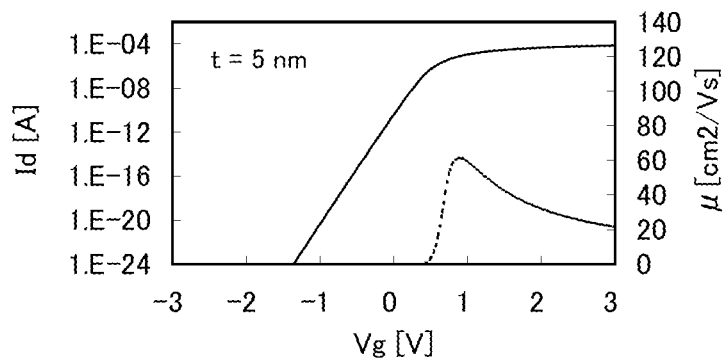

FIGS. 15A to 15C show the gate voltage $V_g$ dependence of the drain current $I_d$ (solid line) and the mobility μ (dotted line) of the transistor that has the structure in FIG. 13B and has an offset length ($L_{off}$) of 5 nm. Here, the drain current $I_d$ is calculated on the assumption the drain voltage $V_d$ is +1 V, and the mobility μ is calculated on the assumption the drain voltage $V_d$ is +0.1 V. FIG. 15A shows the gate voltage dependence of the transistor including the gate insulating layer 654 with a thickness of 15 nm. FIG. 15B shows the gate voltage dependence of the transistor including the gate insulating layer 654 with a thickness of 10 nm. FIG. 15C shows the gate voltage dependence of the transistor including the gate insulating layer 654 with a thickness of 5 nm.

Figure 16A:
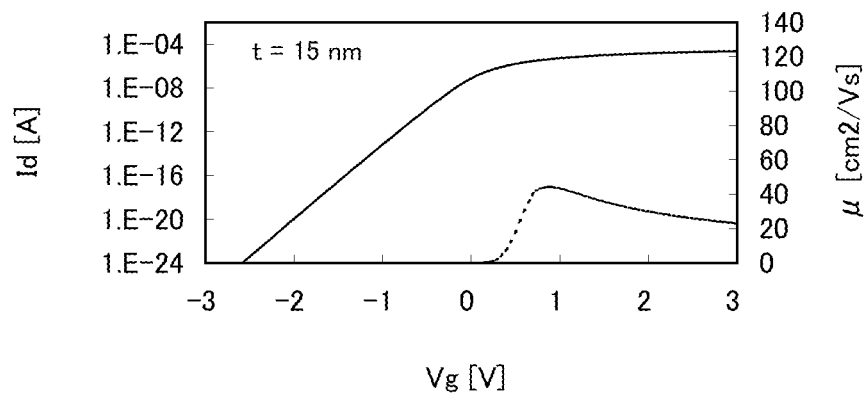
FIGS. 16A to 16C show the result of calculation of electrical characteristics of transistors.
Figure 16B:
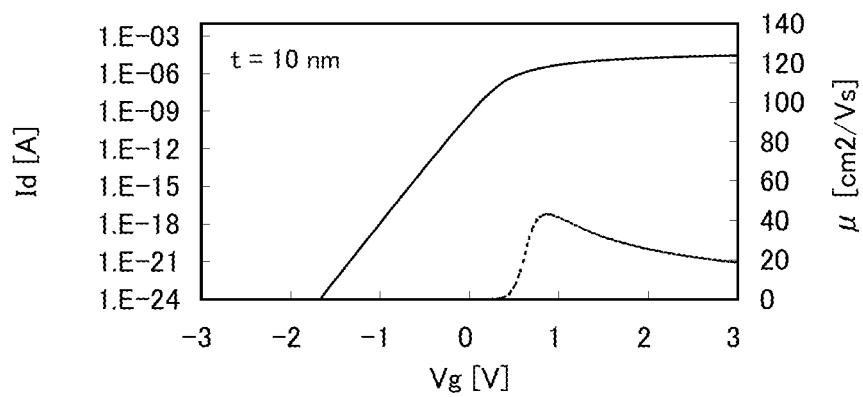
Figure 16C:
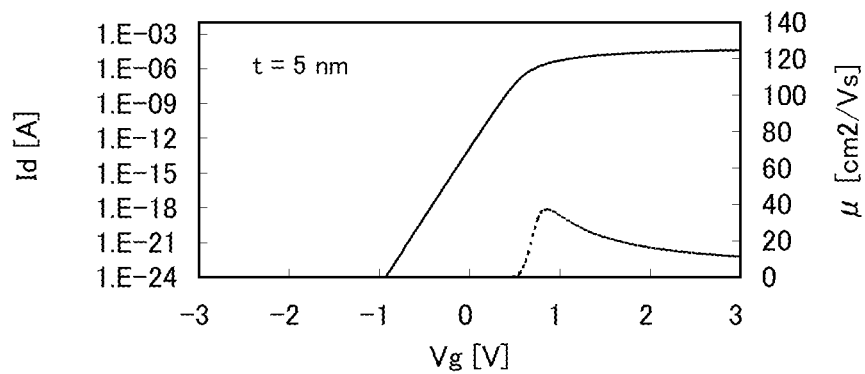

FIGS. 16A to 16C show the gate voltage dependence of the drain current $I_d$ (solid line) and the mobility μ (dotted line) of the transistor that has the structure in FIG. 13B and has an offset length ($L_{off}$) of 15 nm. Here, the drain current $I_d$ is calculated on the assumption the drain voltage $V_d$ is +1 V, and the mobility μ is calculated on the assumption the drain voltage $V_d$ is +0.1 V. FIG. 16A shows the gate voltage dependence of the transistor including the gate insulating layer 654 with a thickness of 15 nm. FIG. 16B shows the gate voltage dependence of the transistor including the gate insulating layer 654 with a thickness of 10 nm. FIG. 16C shows the gate voltage dependence of the transistor including the gate insulating layer 654 with a thickness of 5 nm.

As seen from FIGS. 14A to 14C, FIGS. 15A to 15C, and FIGS. 16A to 16C, as the gate insulating layer 654 is thinner in any of the structures, the off-state current of the transistor is significantly decreased, whereas there is no remarkable tendency in the peak value of the mobility μ and the on-state current of the transistor.

The peak of the field-effect mobility μ is about 80 cm²/V·s in FIGS. 14A to 14C, about 60 cm²/V·s in FIGS. 15A to 15C, and about 40 cm²/V·s in FIGS. 16A to 16C; thus, the peak of the mobility μ decreases as the offset length ($L_{off}$) is increased.

The same applies to the off-state current of the transistor. The on-state current of the transistor also decreases as the offset length ($L_{off}$) is increased; however, the decrease in the on-state current is much more gradual than the decrease in the off-state current of the transistor. Further, the drain current exceeds 10 μA, which is needed for a storage circuit and the like, at a gate voltage around 1 V.

Since the field-effect mobility of the transistor including an oxide semiconductor can be high as described above, the transistor can operate the arithmetic circuit in any of the above embodiments without problems.

Next, as another example of the transistor, an example of a transistor that includes an oxide semiconductor layer containing In, Sn, and Zn as a channel formation layer will be described.

Figure 17A:
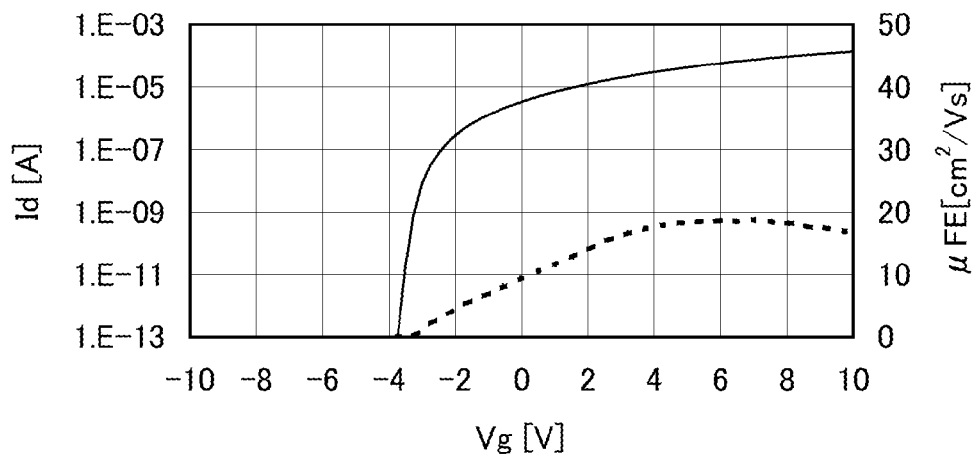
FIGS. 17A to 17C show the result of measurement of electrical characteristics of a transistor.
Figure 17B:
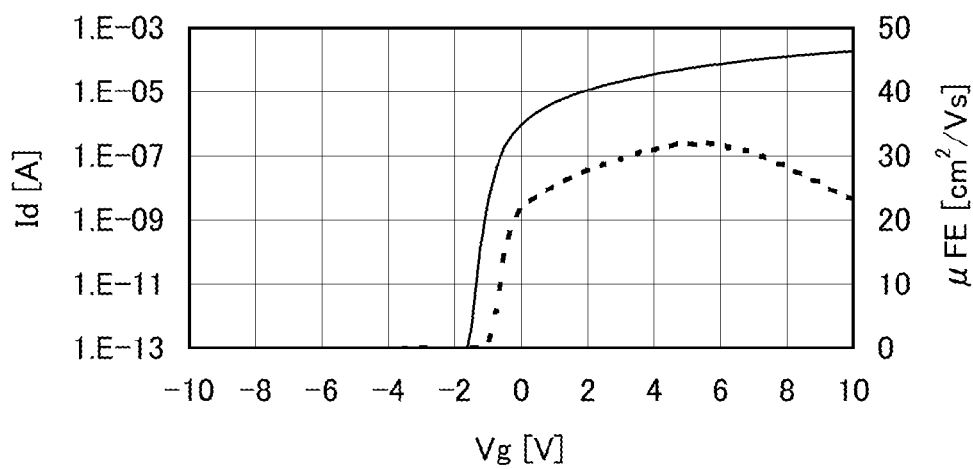
Figure 17C:
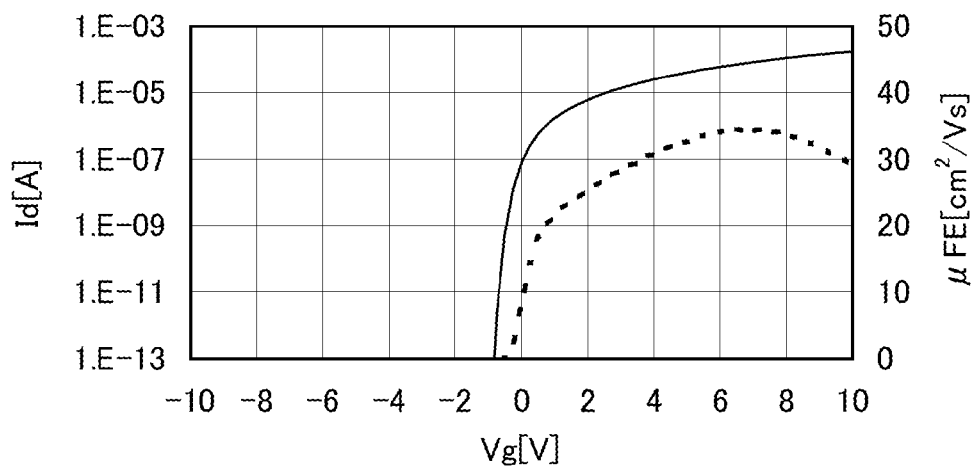

FIGS. 17A to 17C show characteristics of a transistor that includes an oxide semiconductor layer containing In, Sn, and Zn as its main components and a 100-nm-thick gate insulating layer, and has a channel length L of 3 μm and a channel width W of 10 μm. Note that $V_d$ is 10 V.

FIG. 17A shows characteristics of a transistor in which an oxide semiconductor layer is formed by deposition of an oxide semiconductor film containing In, Sn, and Zn as its main components by sputtering without heating an element formation layer intentionally. FIG. 17A shows that the field-effect mobility is 18.8 cm$^2$/V·s. FIG. 17B shows characteristics of a transistor in which an oxide semiconductor layer is formed by deposition of an oxide semiconductor film containing In, Sn, and Zn as its main components by sputtering while a substrate is heated at 200° C. FIG. 17B shows that the field-effect mobility is 32.2 cm$^2$/V·s. This means that intentional heating increases the field-effect mobility of the transistor.

FIG. 17C shows characteristics of a transistor in which an oxide semiconductor layer is formed by deposition of an oxide semiconductor film containing In, Sn, and Zn as its main components by sputtering at 200° C. and then subjected to heat treatment at 650° C. FIG. 17C shows that the field-effect mobility is 34.5 cm$^2$/V·s. This means that heat treatment performed after the oxide semiconductor film is deposited increases the field-effect mobility.

Note that the oxide semiconductor layer containing In, Sn, and Zn as its main components may be crystallized in the following manner: oxygen ions are implanted into the oxide semiconductor layer, impurities such as hydrogen, water, a hydroxyl group, or hydride included in the oxide semiconductor are released by heat treatment, and the oxide semiconductor layer is crystallized through the heat treatment or by another heat treatment performed later. By such crystallization treatment or recrystallization treatment, a non-single-crystal oxide semiconductor layer with favorable crystallinity can be obtained.

As for the transistor including the oxide semiconductor layer that contains In, Sn, and Zn as its main components and is formed without heating the element formation layer intentionally, the threshold voltage tends to be negative as shown in FIG. 17A, for example. In contrast, as for the transistor including the oxide semiconductor layer that is formed while the element formation layer is intentionally heated, the threshold voltage is higher than that in the case where the element formation layer is not heated, so that the transistor can be close to a normally-off transistor as shown in FIG. 17B, for example. It is thus found that at least one of the heat treatment during the deposition of the oxide semiconductor film and the heat treatment after the deposition makes the transistor more likely to be normally off.

The threshold voltage of a transistor can also be controlled by changing the ratio of In, Sn, and Zn. For example, when the composition ratio of In, Sn, and Zn in the oxide semiconductor film is 2:1:3, the transistor is more likely to be normally off.

For example, when a gate bias is applied with an electric field of 2 MV/cm at 150° C. for 1 hour to perform a bias-temperature stress test (BT test), the drift of the threshold voltage is less than ±1.5 V, preferably less than ±1.0 V. This means that the stability against gate-bias stress is enhanced by at least one of the heat treatment during the deposition of the oxide semiconductor film and the heat treatment after the deposition. FIGS. 18A and 18B and FIGS. 19A and 19B show the results of the BT test performed on the following two transistors: Sample 1 on which heat treatment is not performed after formation of an oxide semiconductor film, and Sample 2 on which heat treatment at 650° C. is performed after formation of an oxide semiconductor film. As the BT test, a positive BT test and a negative BT test were performed.

In the positive BT test, first, $V_g$-$I_d$ characteristics of the transistors were measured at a temperature of element formation layers (substrates) of 25° C. and $V_d$ of 10 V. Then, the temperature of the element formation layers (substrates) was set to 150° C. and $V_d$ was set to 0.1 V. After that, $V_g$ of 20 V was applied so that the intensity of an electric field applied to gate insulating layers was 2 MV/cm, and the condition was kept for 1 hour. Next, $V_g$ was set to 0 V. Then, $V_g$-$I_d$ characteristics of the transistors were measured at a temperature of the element formation layers (substrates) of 25° C. and $V_d$ of 10 V.

In the negative BT test, first, $V_g$-$I_d$ characteristics of the transistors were measured at a temperature of the element formation layers (substrates) of 25° C. and $V_d$ of 10 V. Then, the temperature of the element formation layers (substrates) was set to 150° C. and $V_d$ was set to 0.1 V. After that, $V_g$ of −20 V was applied so that the intensity of an electric field applied to the gate insulating layers was −2 MV/cm, and the condition was kept for 1 hour. Next, $V_g$ was set to 0 V. Then, $V_g$-$I_d$ characteristics of the transistors were measured at a temperature of the element formation layers (substrates) of 25° C. and $V_d$ of 10 V.

Figure 18A:
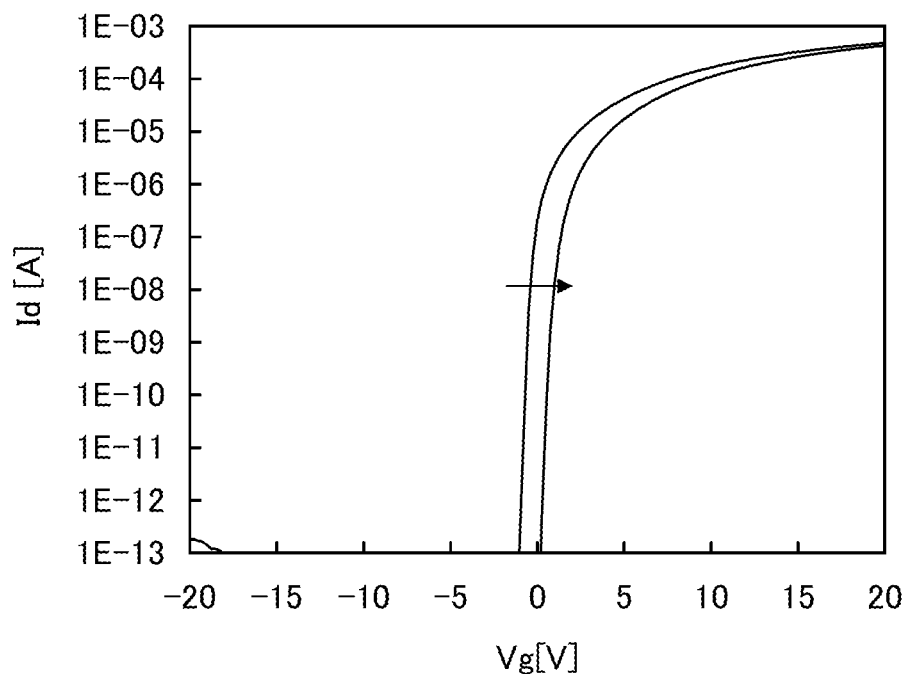
FIGS. 18A and 18B show the result of measurement of electrical characteristics of transistors.
Figure 18B:
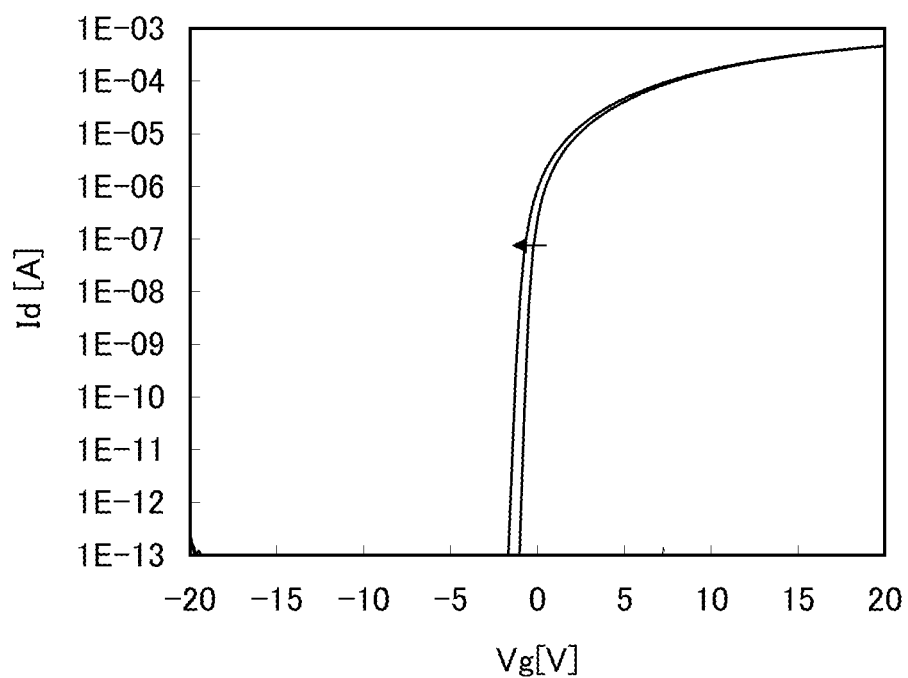
Figure 19A:
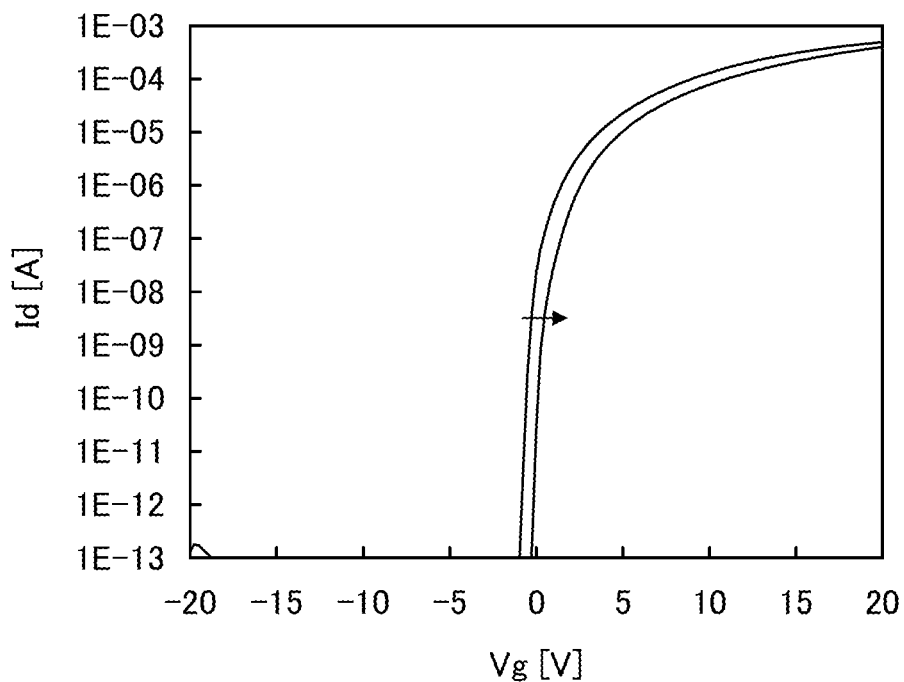
FIGS. 19A and 19B show the result of measurement of electrical characteristics of transistors.
Figure 19B:
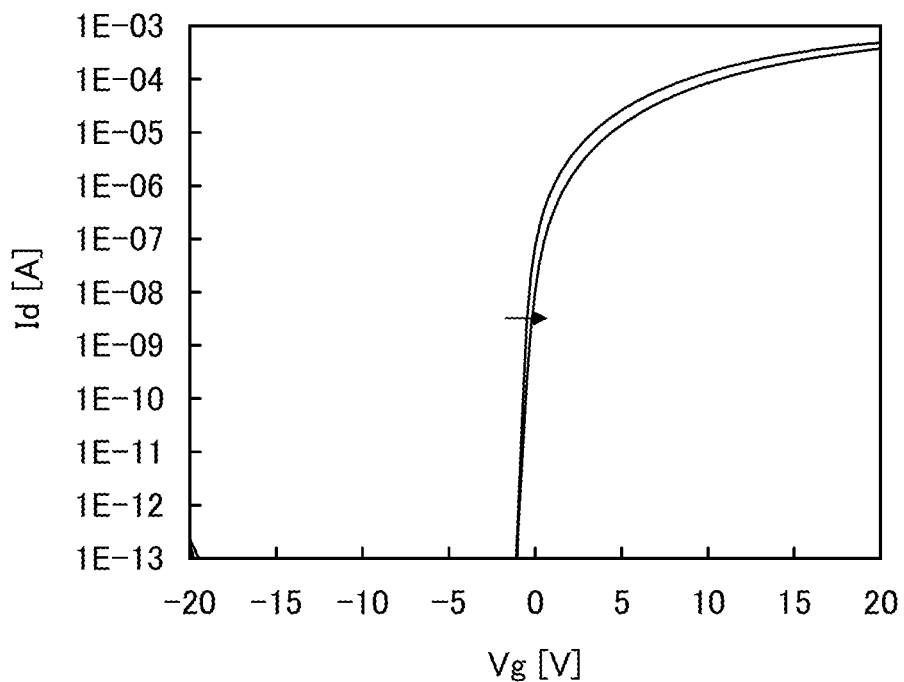

FIGS. 18A and 18B show the result of the positive BT test of Sample 1 and the result of the negative BT test of Sample 1, respectively. FIGS. 19A and 19B show the result of the positive BT test of Sample 2 and the result of the negative BT test of Sample 2, respectively.

As shown in FIGS. 18A and 18B, the amount of shift in the threshold voltage of Sample 1 due to the positive BT test and that due to the negative BT test were 1.80 V and −0.42 V, respectively. As shown in FIGS. 19A and 19B, the amount of shift in the threshold voltage of Sample 2 due to the positive BT test and that due to the negative BT test were 0.79 V and 0.76 V, respectively. It is therefore found that in both Sample 1 and Sample 2, the amount of shift in the threshold voltage of the transistor between before and after the BT tests is small and the reliability is high.

In addition, when an oxide semiconductor film that is formed by sputtering using a metal oxide target having a composition ratio of In:Sn:Zn=1:1:1 without heating an element formation layer intentionally is analyzed by X-ray diffraction (XRD), a halo pattern is observed. However, the oxide semiconductor film can be crystallized by being subjected to heat treatment. The temperature of the heat treatment at that time can be set as appropriate; when the heat treatment is performed at 650° C., for example, a clear diffraction peak can be observed in X-ray diffraction.

Here, the results of XRD measurement of an In—Sn—Zn—O film are shown below. The XRD measurement was conducted using an X-ray diffractometer D8 ADVANCE manufactured by Bruker AXS, and the measurement was performed by an out-of-plane method.

Sample A and Sample B were prepared and the XRD measurement was performed thereon. A method of fabricating Sample A and Sample B will be described below.

An In—Sn—Zn—O film with a thickness of 100 nm was formed over a quartz substrate that had been subjected to dehydrogenation treatment.

The In—Sn—Zn—O film was deposited with a sputtering apparatus with a power of 100 W (DC) in an oxygen atmosphere. As a target for the sputtering, an In—Sn—Zn—O target having an atomic ratio of In:Sn:Zn=1:1:1 was used. The heating temperature at the deposition was 200° C. A sample fabricated in the above step was Sample A.

Next, a sample fabricated by a method similar to that of Sample A was subjected to heat treatment at 650° C. Here, heat treatment in a nitrogen atmosphere was performed for 1 hour and then, heat treatment in an oxygen atmosphere was performed for 1 hour without lowering the temperature. A sample fabricated in the above steps was Sample B.

Figure 20:
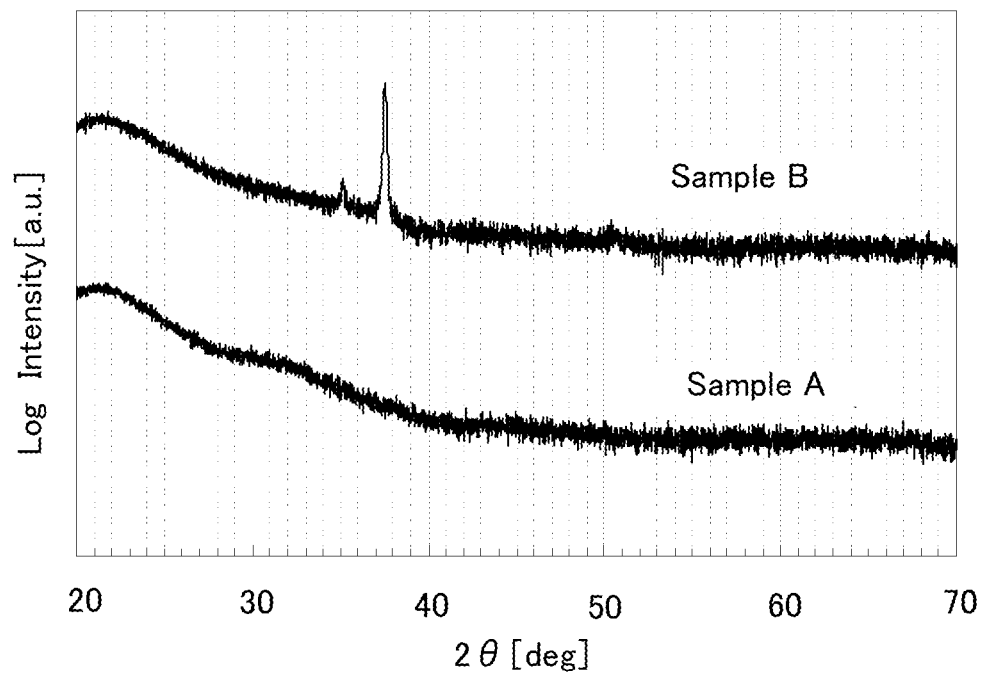
FIG. 20 shows XRD spectra of oxide semiconductor layers used in transistors.

FIG. 20 shows XRD spectra of Sample A and Sample B. No peak derived from a crystal was observed in Sample A, whereas peaks derived from a crystal were observed when 2θ was around 35° and at 37° to 38° in Sample B. This means that the crystallinity of the oxide semiconductor layer is increased by at least one of the heat treatment during the deposition of the oxide semiconductor film containing In, Sn, and Zn as its main components and the heat treatment after the deposition.

Figure 21:
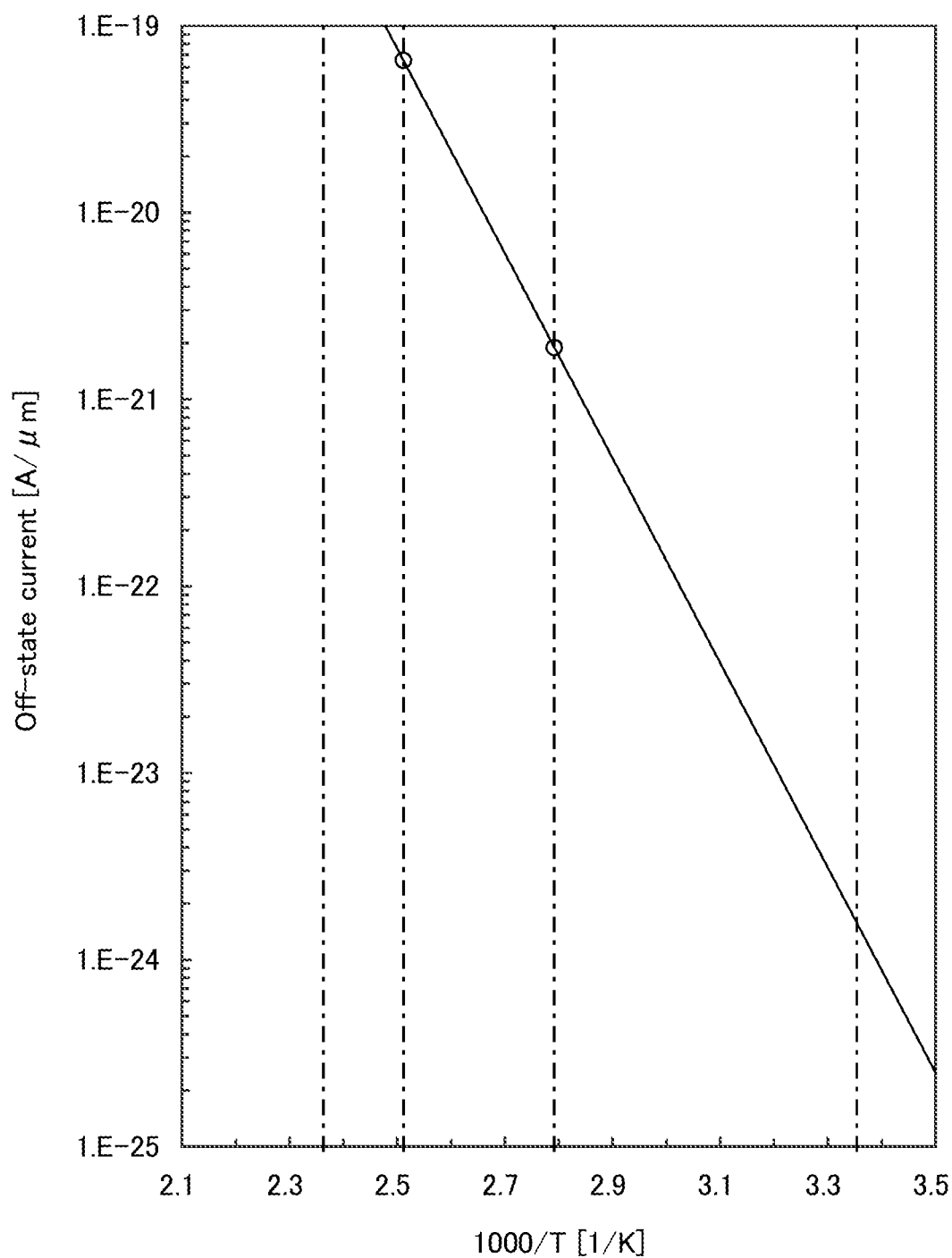
FIG. 21 shows characteristics of a transistor.

By performing at least one of the heat treatment during the deposition of the oxide semiconductor film and the heat treatment after the deposition, the off-state current of the fabricated transistor per micrometer of channel width was 0.1 aA ($1 \times 10^{-19}$ A) or lower and 10 zA ($1 \times 10^{-20}$ A) or lower when the temperature of the element formation layer (substrate) was 125° C. and 85° C., respectively, as shown in FIG. 21, for example. The proportional relation between the logarithm of the off-state current and the inverse of the temperature suggests that the off-state current of the above transistor per micrometer of channel width at room temperature (27° C.) is 0.1 zA ($1 \times 10^{-22}$ A) or lower. Hence, the off-state current of the above transistor per micrometer of channel width can be 1 aA ($1 \times 10^{-18}$ A) or lower, 100 zA ($1 \times 10^{-19}$ A) or lower, and 1 zA ($1 \times 10^{-21}$ A) or lower at 125° C., 85° C., and room temperature (27° C.), respectively.

Although hydrogen can be removed from an oxide semiconductor film containing In, Sn, and Zn as its main components by heat treatment, a film that does not contain impurities inherently is preferably formed because moisture is released from the oxide semiconductor film at a higher temperature than from an oxide semiconductor containing In, Ga, and Zn as its main components.

In addition, the relation between the temperature of the element formation layer (substrate) and electrical characteristics of a sample, on which heat treatment at 650° C. was performed after formation of the oxide semiconductor film, was evaluated.

The transistor used for the measurement has a channel length L of 3 μm, a channel width W of 10 μm, $L_{ov}$ of 3 μm on one side (total $L_{ov}$ of 6 μm), and dW of 0 μm. Note that $V_d$ was 10 V. The measurement was performed under the following six conditions: the temperatures of the element formation layer (substrate) were −40° C., −25° C., 25° C., 75° C., 125° C., and 150° C. Note that $L_{ov}$ represents the length in the channel length direction of a portion where a gate electrode overlaps with one of a pair of source and drain electrodes, and dW represents the width of a portion of the pair of electrodes in the channel width direction, which does not overlap with an oxide semiconductor film.

Figure 22:
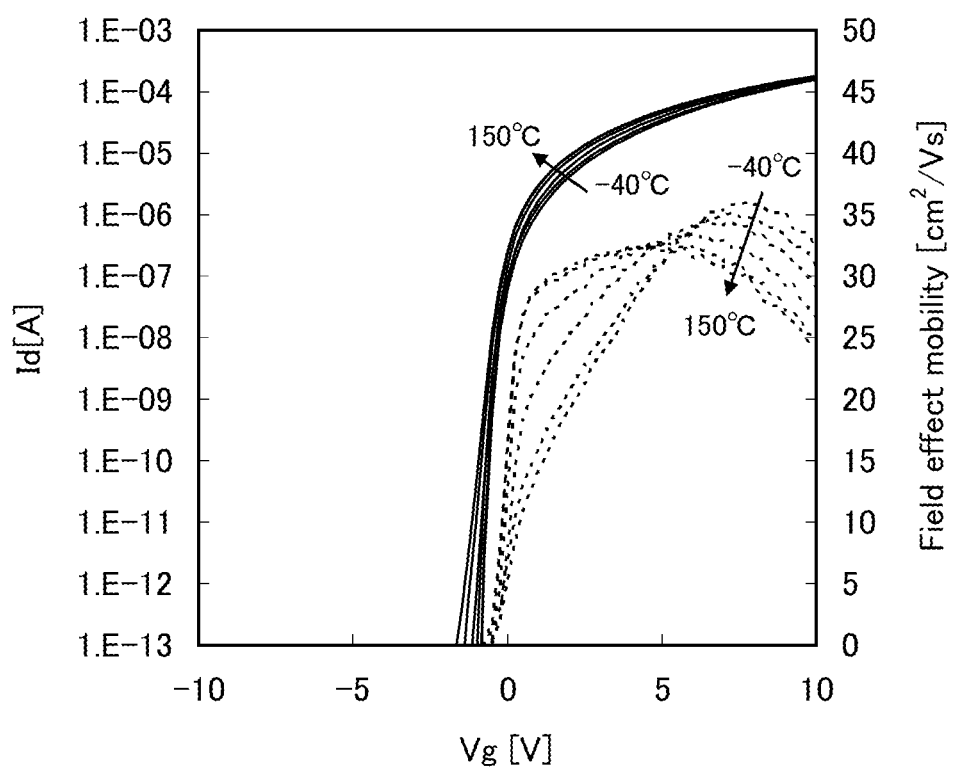
FIG. 22 shows characteristics of transistors.
Figure 23A:
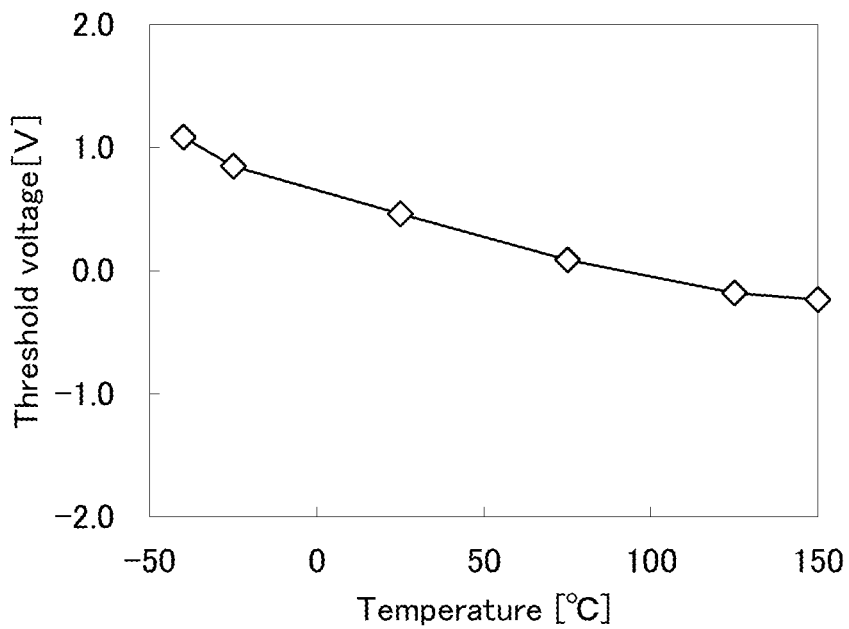
FIGS. 23A and 23B show characteristics of transistors.
Figure 23B:
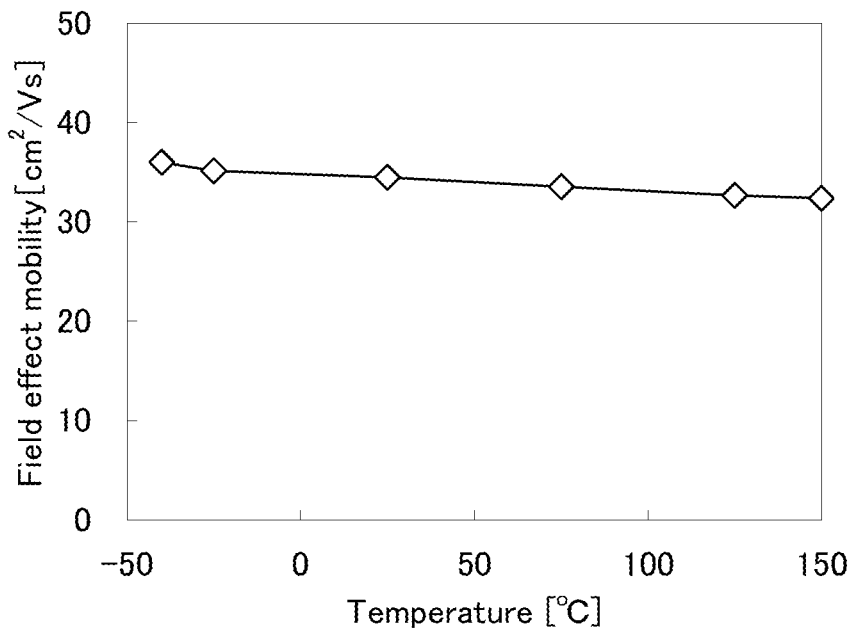

FIG. 22 shows the $V_g$ dependence of $I_d$ (solid line) and the field-effect mobility (dotted line). FIG. 23A shows the relation between the threshold voltage and the temperature of the element formation layer (substrate). FIG. 23B shows the relation between the field-effect mobility and the temperature of the element formation layer (substrate).

From FIG. 22 and FIG. 23A, it is found that the threshold voltage gets lower as the temperature of the element formation layer (substrate) increases. Note that the threshold voltage is decreased from 1.09 V to −0.23 V in the range from −40° C. to 150° C.

From FIG. 22 and FIG. 23B, it is found that the field-effect mobility gets lower as the temperature of the element formation layer (substrate) increases. Note that the field-effect mobility is decreased from 36 cm²/V·s to 32 cm²/V·s in the range from −40° C. to 150° C. Thus, it is found that variation in electrical characteristics is small in the above temperature range.

The above is the description of the transistors including the oxide semiconductor layer containing In, Sn, and Zn.

In the transistor including the oxide semiconductor layer containing In, Sn, and Zn as its main components, the field-effect mobility can be 30 cm²/V·s or higher, preferably 40 cm²/V·s or higher, more preferably 60 cm²/V·s or higher with the off-state current maintained at 1 aA/μm or lower, and can have on-state current high enough to meet the specifications demanded for LSI's. For example, in a transistor with a channel width of 40 nm and a channel length of 33 nm, an on-state current of 12 μA or higher can flow when the gate voltage is 2.7 V and the drain voltage is 1.0 V. Moreover, the transistor can have favorable electrical characteristics in the operating temperature range of transistors. Since the transistor including the oxide semiconductor layer has such characteristics, even when the transistor including the oxide semiconductor layer is included in a circuit constituted by transistors including semiconductor layers containing a semiconductor of Group 14 (e.g., silicon), a circuit having a novel function can be provided without decreasing the operation speed.

(Embodiment 3)

This embodiment will show an example of an arithmetic processing unit such as a CPU.

An example of the arithmetic processing unit in this embodiment is described with reference to FIG. 24.

Figure 24:
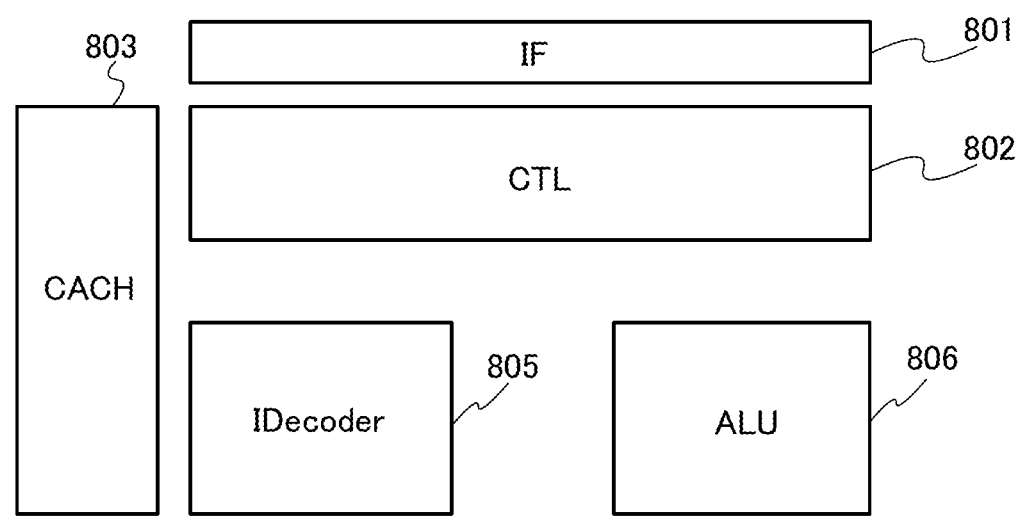
FIG. 24 illustrates an example of an arithmetic processing unit.

The arithmetic processing unit in FIG. 24 includes a bus interface (also referred to as IF) 801, a control unit (also referred to as CTL) 802, a cache memory (also referred to as CACH) 803, an instruction decoder (also referred to as IDecoder) 805, and an arithmetic logic unit (also referred to as ALU) 806.

The bus interface 801 has a function of transmitting and receiving signals with an external unit and a function of exchanging signals with circuits in the arithmetic processing unit, and the like.

The control unit 802 has a function of controlling operations of the circuits in the arithmetic processing unit.

For example, the control unit 802 can include the integrated circuit in any of the above embodiments.

The cache memory 803 is controlled by the control unit 802 and has a function of temporary retaining data during the operation of the arithmetic processing unit. Note that the arithmetic processing unit may include a plurality of cache memory 803 as a primary cache and a secondary cache, for example.

The instruction decoder 805 has a function of translating an instruction signal which is read. The translated instruction signal is input to the control unit 802, and the control unit 802 outputs a control signal in accordance with the instruction signal to the arithmetic logic unit 806.

For example, the instruction decoder 805 can include the arithmetic circuit in any of the above embodiments.

The arithmetic logic unit 806 is controlled by the control unit 802 and has a function of performing logic operation processing in accordance with the input instruction signal.

For example, the arithmetic logic unit 806 can include the arithmetic circuits in any of the above embodiments.

Note that a register may be provided in the arithmetic processing unit. In that case, the register is controlled by the control unit 802. For example, a plurality of registers may be provided in the arithmetic processing unit, and some registers may be used for the arithmetic logic unit 806 and other registers may be used for the instruction decoder 805.

As described with reference to FIG. 24, the arithmetic processing unit exemplified in this embodiment includes the arithmetic circuit in any of the above embodiments in a unit such as the control unit, the instruction decoder, or the arithmetic logic unit, so that each unit can hold data in each unit and the processing speed can be increased.

Further, in the arithmetic processing unit exemplified in this embodiment, the arithmetic circuit in the above embodiment allows the data to be held for a long time while saving power. Accordingly, the power consumption of the arithmetic processing unit can be reduced. Further, the arithmetic processing unit including the arithmetic circuit in this embodiment can have a smaller area.

(Embodiment 4)

This embodiment will show examples of electronic appliances each provided with the arithmetic processing unit of any of the above embodiments.

Structural examples of the electronic appliances of this embodiment will be described with reference to FIGS. 25A to 25D.

Figure 25A:
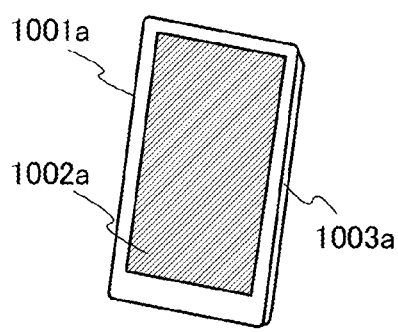
FIGS. 25A to 25D each illustrate an example of an electronic appliance.

An electronic appliance in FIG. 25A is an example of a mobile information terminal The mobile information terminal in FIG. 25A includes a housing 1001a and a display portion 1002a provided in the housing 1001a.

Note that a side surface 1003a of the housing 1001a may be provided with one or both of a connection terminal for connecting the mobile information terminal to an external device and a button for operating the mobile information terminal in FIG. 25A.

The housing 1001a of the mobile information terminal in FIG. 25A includes a CPU, a storage circuit, an interface for transmitting and receiving signals between the external device and each of the CPU and the storage circuit, and an antenna for transmitting and receiving the signals to and from the external device.

The mobile information terminal in FIG. 25A serves as one or more of a telephone set, an e-book reader, a personal computer, and a game machine, for example.

Figure 25C:
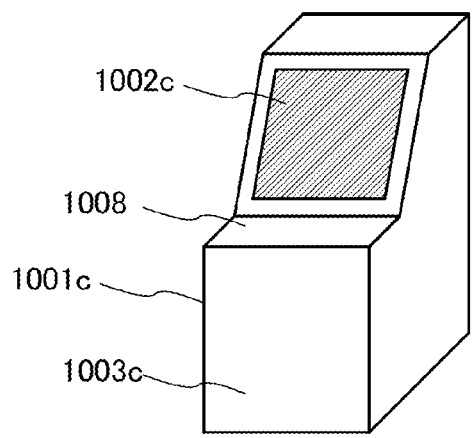
Figure 25B:
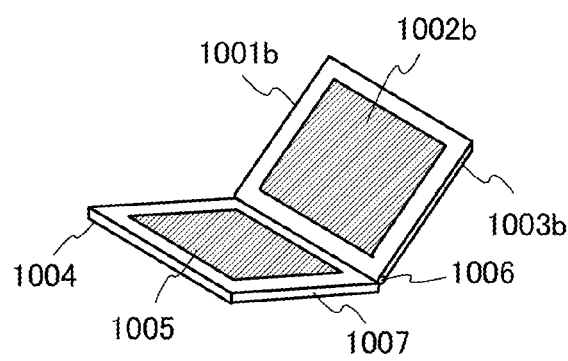

An electronic appliance in FIG. 25B is an example of a folding mobile information terminal The mobile information terminal in FIG. 25B includes a housing 1001b, a display portion 1002b provided in the housing 1001b, a housing 1004, a display portion 1005 provided in the housing 1004, and a hinge 1006 for connecting the housing 1001b and the housing 1004.

In the mobile information terminal in FIG. 25B, the housing 1001b can be stacked on the housing 1004 by moving the housing 1001b or the housing 1004 with the hinge 1006.

Note that a side surface 1003b of the housing 1001b or a side surface 1007 of the housing 1004 may be provided with one or both of a connection terminal for connecting the mobile information terminal to an external device and a button for operating the mobile information terminal in FIG. 25B.

The display portion 1002b and the display portion 1005 may display different images or one image. Note that the display portion 1005 is not necessarily provided, and a keyboard which is an input device may be provided instead of the display portion 1005.

The housing 1001b or the housing 1004 of the mobile information terminal in FIG. 25B includes a CPU, a storage circuit, and an interface for transmitting and receiving signals between the external device and each of the CPU and the storage circuit. Note that the mobile information terminal in FIG. 25B may include an antenna an antenna for transmitting and receiving the signals to and from the external device.

The mobile information terminal in FIG. 25B serves as one or more of a telephone set, an e-book reader, a personal computer, and a game machine, for example.

An electronic appliance in FIG. 25C is an example of a stationary information terminal The stationary information terminal illustrated in FIG. 25C includes a housing 1001c and a display portion 1002c provided in the housing 1001c.

Note that the display portion 1002c can be provided on a countertop portion 1008 of the housing 1001c.

The stationary information terminal in FIG. 25C includes a CPU, a storage circuit, and an interface for transmitting and receiving signals between the external device and each of the CPU and the storage circuit in the housing 1001c. Note that the stationary information terminal in FIG. 25C may include an antenna for transmitting and receiving the signals to and from the external device.

Further, a side surface 1003c of the housing 1001c in the stationary information terminal in FIG. 25C may be provided with one or more portions selected from a ticket ejection portion that ejects a ticket or the like, a coin slot portion, and a bill slot portion.

The stationary information terminal in FIG. 25C serves, for examples, as an automated teller machine, an information communication terminal for ticketing or the like (also referred to as multi-media station), or a game machine.

Figure 25D:
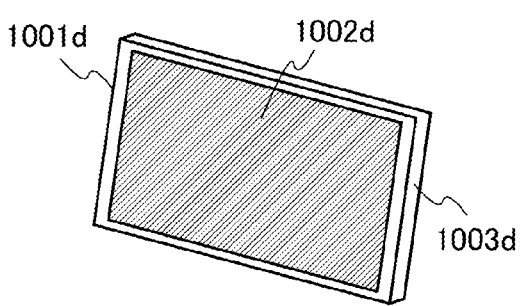

FIG. 25D illustrates an example of a stationary information terminal. The stationary information terminal in FIG. 25D includes a housing 1001d and a display portion 1002d provided in the housing 1001d. Note that a support for supporting the housing 1001d may also be provided.

Note that a side surface 1003d of the housing 1001d may be provided with one or both of a connection terminal for connecting the stationary information terminal to an external device and a button for operating the stationary information terminal in FIG. 25D.

The stationary information terminal in FIG. 25D includes a CPU, a storage circuit, and an interface for transmitting and receiving signals between the external device and each of the CPU and the storage circuit in the housing 1001d. Note that the stationary information terminal in FIG. 25D may include an antenna for transmitting and receiving the signals to and from the external device.

The stationary information terminal in FIG. 25D serves as a digital photoframe, a monitor, or a television set, for example.

The arithmetic processing unit in the above embodiment is used as the CPU in any of the electronic appliances in FIGS. 25A to 25D.

As described with reference to FIGS. 25A to 25D, the examples of the electronic appliances in this embodiment each include the arithmetic processing unit in the above embodiment as the CPU.

Further, in the electronic appliances exemplified in this embodiment, the arithmetic processing unit in the above embodiment allows the data to be held for a long time while saving power. Accordingly, the power consumption of the arithmetic processing unit can be reduced. Further, the arithmetic processing unit including the arithmetic circuit in this embodiment can have a smaller area.

This application is based on Japanese Patent Application serial no. 2011-112845 filed with Japan Patent Office on May 19, 2011, the entire contents of which are hereby incorporated by reference.

What is claimed is:

1. A circuit comprising:
an arithmetic circuit having a function of performing a logic operation processing based on an input signal, storing a potential corresponding to a result of the logic operation processing as stored data, and outputting a signal with a value corresponding to the stored data as an output signal, the arithmetic circuit includes:
an arithmetic portion performing the logic operation processing,
a first field-effect transistor controlling whether a potential of the stored data is set at the potential corresponding to the result of the logic operation processing,
a second field-effect transistor controlling whether the potential of the stored data is set at a reference potential, and
a third field-effect transistor controlling whether the signal with a value corresponding to the stored data is output as the output signal,
wherein each of the first and second field-effect transistors, the third field-effect transistor, or each of the first to third field-effect transistors includes an oxide semiconductor layer including a channel formation region, and
wherein the oxide semiconductor layer includes a crystal aligned along a c-axis.

2. The circuit according to claim 1, wherein an off-state current per micrometer of channel width of each of the first and second field-effect transistors, the third field-effect transistor, or each of the first to third field-effect transistors is lower than or equal to $1\times10^{-17}$ A.

3. The circuit according to claim 1, wherein an off-state current per micrometer of channel width of each of the first and second field-effect transistors, the third field-effect transistor, or each of the first to third field-effect transistors is lower than or equal to $1\times10^{-21}$ A.

4. The circuit according to claim 1,
wherein the crystal has a triangular or hexagonal atomic arrangement when seen from a direction of an a-b plane, a surface, or an interface,
wherein the crystal has a layered arrangement of a metal atom along the c-axis or a layered arrangement of the metal atom and an oxygen atom along the c-axis, and
wherein a direction of an a-axis or a b-axis is varied in the a-b plane.

5. A circuit comprising:
an arithmetic portion;
a first transistor;
a second transistor; and
a third transistor,
wherein one of a source electrode and a drain electrode of the first transistor is directly connected to the arithmetic portion,
wherein the other of the source electrode and the drain electrode of the first transistor is directly connected to one of a source electrode and a drain electrode of the second transistor, and
wherein the other of the source electrode and the drain electrode of the first transistor and the one of the source electrode and the drain electrode of the second transistor are electrically connected to one of a source electrode and a drain electrode of the third transistor,
wherein each of the first and second transistors, the third transistor, or each of the first to third field-effect transistors includes an oxide semiconductor layer including a channel formation region, and
wherein the oxide semiconductor layer includes a crystal aligned along a c-axis.

6. The circuit according to claim 5, wherein an off-state current per micrometer of channel width of each of the first and second transistors, the third transistor, or each of the first to third transistors is lower than or equal to $1\times10^{-17}$ A.

7. The circuit according to claim 5, wherein an off-state current per micrometer of channel width of each of the first and second transistors, the third transistor, or each of the first to third transistors is lower than or equal to $1\times10^{-21}$ A.

8. The circuit according to claim 5,
wherein the crystal has a triangular or hexagonal atomic arrangement when seen from a direction of an a-b plane, a surface, or an interface,
wherein the crystal has a layered arrangement of a metal atom along the c-axis or a layered arrangement of the metal atom and an oxygen atom along the c-axis, and
wherein a direction of an a-axis or a b-axis is varied in the a-b plane.

9. A circuit comprising:
an arithmetic portion;
a first transistor;
a second transistor;
a third transistor; and
a fourth transistor,
wherein one of a source electrode and a drain electrode of the first transistor is directly connected to the arithmetic portion,
wherein the other of the source electrode and the drain electrode of the first transistor is directly connected to one of a source electrode and a drain electrode of the second transistor,
wherein the other of the source electrode and the drain electrode of the first transistor and the one of the source electrode and the drain electrode of the second transistor are electrically connected to one of a source electrode and a drain electrode of the third transistor, and
wherein the other of the source electrode and the drain electrode of the third transistor is directly connected to one of a source electrode and a drain electrode of the fourth transistor.

10. The circuit according to claim 5 further comprising an inverter,
wherein an input terminal of the inverter is directly connected to a node where the other of the source electrode and the drain electrode of the first transistor and the one of the source electrode and the drain electrode of the second transistor are connected, and
wherein an output terminal of the inverter is connected to the one of the source electrode and the drain electrode of the third transistor.

11. The circuit according to claim 9, wherein an off-state current per micrometer of channel width of each of the first and second transistors, the third transistor, or each of the first to third transistors is lower than or equal to $1\times10^{-17}$ A.

12. The circuit according to claim 9, wherein an off-state current per micrometer of channel width of each of the first and second transistors, the third transistor, or each of the first to third transistors is lower than or equal to $1\times10^{-21}$ A.

13. The circuit according to claim 9,
wherein each of the first and second transistors, the third transistor, or each of the first to third field-effect transistors includes an oxide semiconductor layer including a channel formation region, and
wherein the oxide semiconductor layer includes a crystal aligned along a c-axis.

14. The circuit according to claim 13,
wherein the crystal has a triangular or hexagonal atomic arrangement when seen from a direction of an a-b plane, a surface, or an interface,
wherein the crystal has a layered arrangement of a metal atom along the c-axis or a layered arrangement of the metal atom and an oxygen atom along the c-axis, and
wherein a direction of an a-axis or a b-axis is varied in the a-b plane.

15. The circuit according to claim 13, wherein the oxide semiconductor layer contains indium.

16. A mobile information terminal comprising the circuit according to claim 9, wherein the mobile information terminal comprises a display portion.

17. The circuit according to claim 1, wherein the oxide semiconductor layer contains indium.

18. A mobile information terminal comprising the circuit according to claim 1, wherein the mobile information terminal comprises a display portion.

19. The circuit according to claim 5, wherein the oxide semiconductor layer contains indium.

20. A mobile information terminal comprising the circuit according to claim 5, wherein the mobile information terminal comprises a display portion.

* * * * *

UNITED STATES PATENT AND TRADEMARK OFFICE
CERTIFICATE OF CORRECTION

PATENT NO. : 8,692,579 B2  Page 1 of 1
APPLICATION NO. : 13/471625
DATED : April 8, 2014
INVENTOR(S) : Kiyoshi Kato It is certified that error appears in the above-identified patent and that said Letters Patent is hereby corrected as shown below:

In the Specification

Column 3, line 61, after "second terminal" insert --.--;

Column 11, line 23, after "603_a" delete ",";

Column 11, line 31, after "603_a" delete ",";

Column 11, line 39, after "603_a" delete ",";

Column 21, line 5, after "603_a" insert --,--;

Column 23, line 1, after "603_a" delete ",";

Column 24, line 4, after "603_a" delete ",";

Column 26, lines 24-25, replace "evasluated" with --evaluated--;

Column 26, line 26, replace "denity" with --density--;

Column 27, line 24, replace "$2 \times 10^{-3}$" with --$2 \times 10^{-3}$--;

Column 33, line 41, after "a mobile information terminal" insert --.--;

Column 34, line 24, after "a stationary information terminal" insert --.--.

Signed and Sealed this
Eleventh Day of November, 2014

Michelle K. Lee
*Deputy Director of the United States Patent and Trademark Office*